United States Patent
Akouka et al.

(10) Patent No.: US 8,444,107 B2
(45) Date of Patent: May 21, 2013

(54) WRIST JOINT FOR POSITIONING A TEST HEAD

(75) Inventors: Henri M. Akouka, Moorestown, NJ (US); Christopher L. West, Tabernacle, NJ (US); Charles Nappen, Marlton, NJ (US)

(73) Assignee: inTEST Corporation, Mt. Laurel, NJ (US)

(*) Notice: Subject to any disclaimer, the term of this patent is extended or adjusted under 35 U.S.C. 154(b) by 953 days.

(21) Appl. No.: 10/543,371

(22) PCT Filed: Jan. 26, 2004

(86) PCT No.: PCT/US2004/002103
§ 371 (c)(1),
(2), (4) Date: Jul. 26, 2005

(87) PCT Pub. No.: WO2004/070400
PCT Pub. Date: Aug. 19, 2004

(65) Prior Publication Data
US 2006/0255222 A1 Nov. 16, 2006

Related U.S. Application Data

(60) Provisional application No. 60/442,988, filed on Jan. 28, 2003.

(51) Int. Cl.
*F16M 13/00* (2006.01)
(52) U.S. Cl.
USPC ......... 248/652; 248/124.1; 324/157; 414/590

(58) Field of Classification Search
USPC ............... 248/124.1, 652; 403/53; 324/158.1, 324/157; 414/590, 669
See application file for complete search history.

(56) References Cited

U.S. PATENT DOCUMENTS

| | | | |
|---|---|---|---|
| 2,481,717 A | 9/1949 | Blair | |
| 4,194,437 A | 3/1980 | Rosheim | |
| 4,398,469 A | 8/1983 | Zelli | |
| 4,589,815 A * | 5/1986 | Smith | 324/758 |
| 4,705,447 A * | 11/1987 | Smith | 414/590 |
| 5,971,348 A * | 10/1999 | Thomas | 248/651 |

(Continued)

FOREIGN PATENT DOCUMENTS

| DE | 100 13 445 A1 | 10/2000 |
|---|---|---|
| JP | 8-168480 A | 7/1996 |

(Continued)

OTHER PUBLICATIONS

Rasim et al., A Forward and Reverse Displacement Analysis of a 6-DOF In-Parallel Manipulator, Mech. Mach. Theory, vol. 29, No. 1, pp. 115-124, 1994.

(Continued)

*Primary Examiner* — Bradley Duckworth
(74) *Attorney, Agent, or Firm* — RatnerPrestia

(57) ABSTRACT

An apparatus for supporting a load comprises a pivot apparatus coupled to the load and movable with the load; and a base stationary relative to the pivot apparatus. At least two areas of support are situated between the pivot apparatus and the base. Respectively opposite force components are at the two areas of support. The two areas of support move along a one curved path to tilt the load.

40 Claims, 40 Drawing Sheets

U.S. PATENT DOCUMENTS 6,023,173 A * 2/2000 Khater et al. .................. 324/758
6,837,125 B1 * 1/2005 Herrera-Abella et al. . 74/490.01
7,135,854 B2 * 11/2006 Brian et al. ................. 324/158.1

FOREIGN PATENT DOCUMENTS

| | | |
|---|---|---|
| JP | 8-275938 A | 10/1996 |
| JP | 9-238931 A | 9/1997 |
| JP | 2002-159480 A | 6/2002 |
| WO | WO 00/44530 A | 8/2000 |
| WO | WO 02/39127 A2 | 5/2002 |
| WO | WO 03/005045 A1 | 1/2003 |

OTHER PUBLICATIONS

International Search Report corresponding to Application No. PCT/US2004/002103 dated Jul. 20, 2004.

* cited by examiner

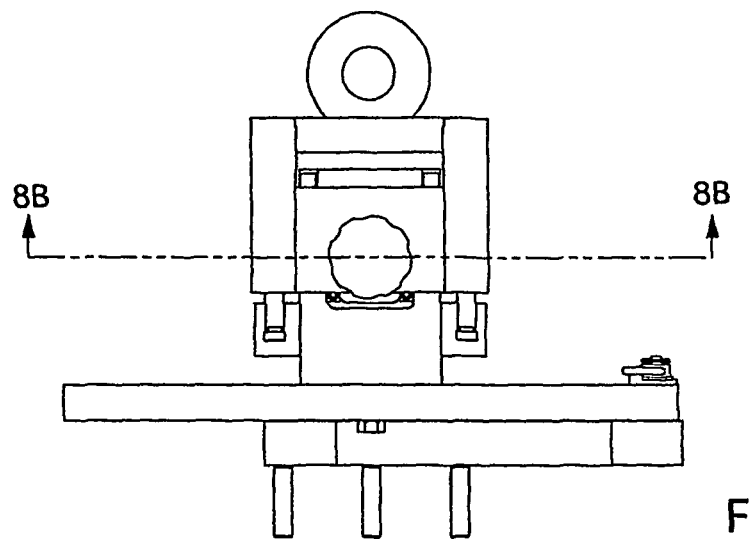
Fig. 8A
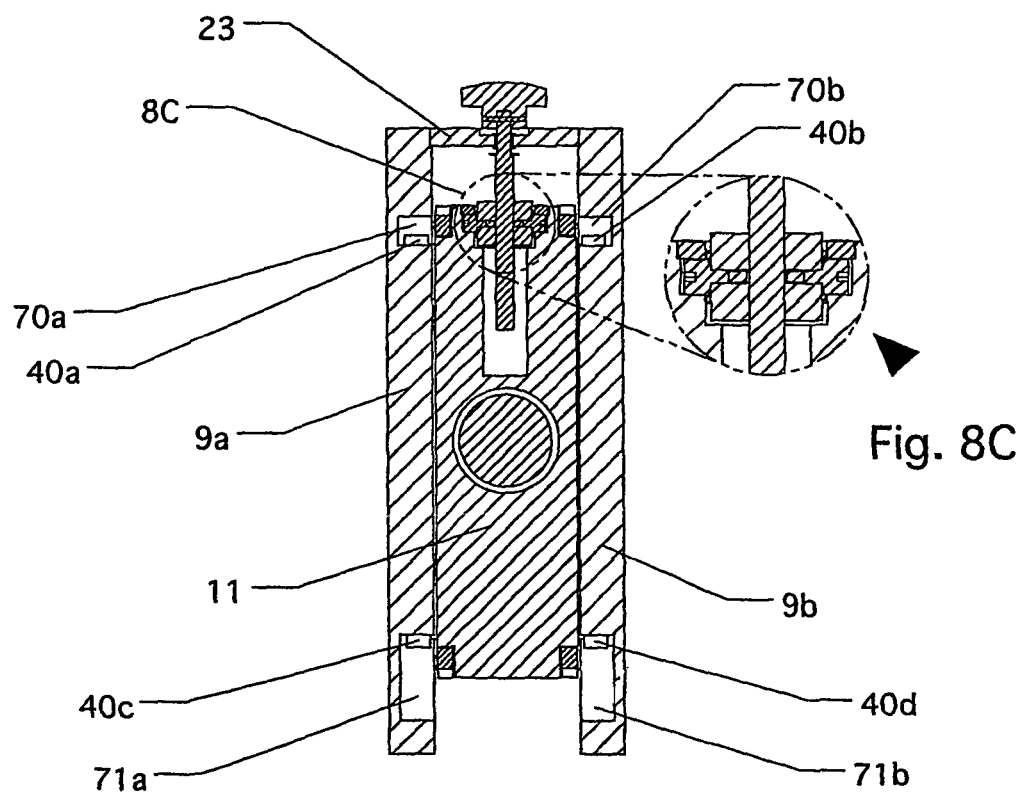
Fig. 8C
Fig. 8B

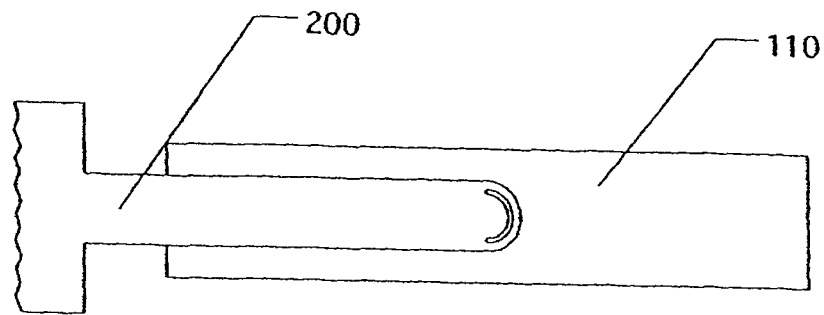
Fig. 24B  *Prior Art*
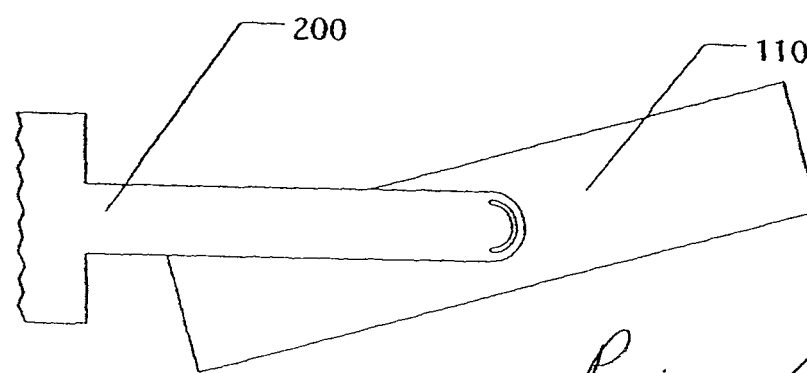
Fig. 24C  *Prior Art*
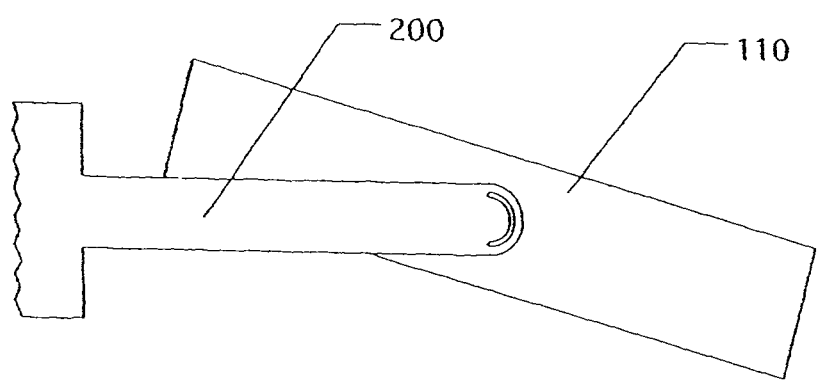
Fig. 24D  *Prior Art*

WRIST JOINT FOR POSITIONING A TEST HEAD

This Application is a U.S. National Phase Application of PCT/US2004/002103.

FIELD OF THE INVENTION

The present invention relates to test head positioner systems and more specifically to test head positioner systems that rotate a test head about an axis. In particular, a positioner system is described which rotates the test head through the movement of a flexible joint situated away from the axis of rotation of the test head.

BACKGROUND OF THE INVENTION

In the manufacture of integrated circuits (ICs) and other electronic devices, testing with automatic test equipment (ATE) is performed at one or more stages of the overall process. A special handling apparatus is used to place the device under test ("DUT") into position for testing. In some cases, the special handling apparatus may also bring the DUT to the proper temperature and/or maintain it at the proper temperature to be tested. The special handling apparatus is of various types including "probers" for testing unpackaged devices on a wafer and "device handlers" for testing packaged parts; herein, "peripheral" or "peripherals" will be used to refer to all types of such apparatus. The electronic testing itself is provided by a large and expensive ATE system. The DUT requires precision, high-speed signals for effective testing; accordingly, the "test electronics" within the ATE, which are used to test the DUT, are typically located in the test head, which must be positioned as close as possible to the DUT. The test head is extremely heavy; the size and weight of the test heads have grown from a few hundred pounds to as much as three to four thousand pounds.

In order to use a test head to test integrated circuits, the test head is typically "docked" to a peripheral. When docked, the test head must be located as close as possible to the peripheral's test site in order to minimize signal degradation. A test head positioning system may be used to position the test head with respect to the peripheral and may be designed to facilitate flexible docking and undocking of a test head with a variety of peripherals. A test head positioning system may also be referred to as a test head positioner or test head manipulator.

The test head is typically mounted in a cradle, which allows the test head to pivot so that it can be aligned with the peripheral. Thus, to assure proper orientation, it is desirable for the test head to be able to pivot compliantly within the cradle. A top view of a test head in a cradle is shown in FIG. 24A, where test head 110 is situated within cradle 200. In other words, cradle 200 is situated around test head 110. Side views are shown in FIGS. 24B through 24D. In FIG. 24B, test head 110 is oriented horizontally relative to cradle 200. As shown in FIGS. 24C and 24D, test head 110 may be rotated counter-clockwise or clockwise from a horizontal position. Again, in this manner, the docking surface of test head 110 may be oriented to be parallel with the reciprocal docking surface of the peripheral, which is not shown.

In some applications, particularly as test heads have become more complex, the width of test head 110 may be substantially large. Thus, due to physical restrictions imposed by the peripheral, test head 110 may be so large that there is simply no room to have a cradle situated on the sides of the test head. While test head mounting schemes which support the test head with pivot mechanisms contained inside the test head are known (WIPO WO 01/04644 and WIPO WO 02/025292), these have the undesirable property of occupying valuable volume inside the test head that could be required for test electronics.

SUMMARY OF THE INVENTION

An apparatus for supporting a load comprises a pivot apparatus coupled to the load and movable with the load; and a base stationary relative to the pivot apparatus. At least two areas of support are situated between the pivot apparatus and the base. Respectively opposite force components are at the two areas of support. The two areas of support move along a curved path to tilt the load.

BRIEF DESCRIPTION OF THE DRAWINGS

FIG. 8A is a top view of the housing.

FIG. 8B is a cross-sectional front view of the housing.

FIGS. 24A-24D are prior art views showing a test head in a prior art cradle.

DETAILED DESCRIPTION OF THE INVENTION

Figure 1A:
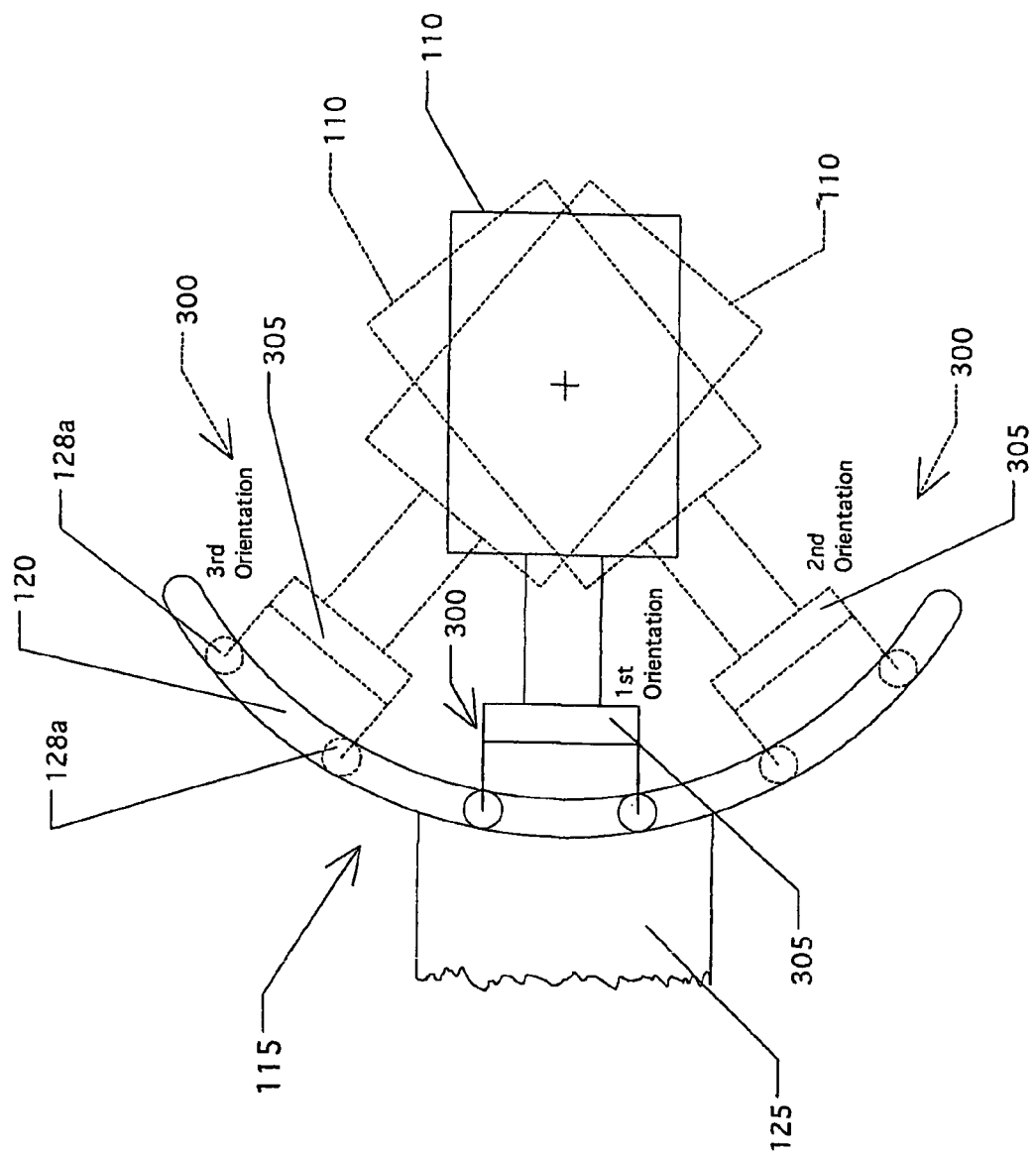
FIG. 1A is a side view showing various orientations of a test head with a portion of a test head positioner in accordance with an exemplary embodiment of the present invention.

An exemplary conceptual embodiment of the present invention in two dimensions is illustrated through the partial views shown in FIG. 1A. FIG. 1A illustrates test head 110 coupled to positioner system 115 by a pivot apparatus ("wrist joint") 300, which includes trunion 305. It is understood, however, that test head 110 can be replaced with any load. In FIG. 1A, three possible orientations of an exemplary test head 110 are shown. Test head 110 is coupled to trunion 305 which may include circular members (for example, bearing wheels or cam followers 128a and 128b) that are situated in curved path 120. In an alternative embodiment, the circular members may be replaced with another structural item (for example, a sliding member) to maintain trunion 305 in curved path 120.

In the first orientation, test head 110 is shown in a horizontal configuration. In the second orientation, the front of test head 110 is tilted upwards (and the rear of test head 110 is tilted downwards) so that test head 110 is rotated counter-clockwise relative to the first orientation. Also, as can be seen, the test head is not pivoting within a cradle. In other words, a cradle does not extend along the sides of the test head with side pivot points about which the test head rotates. Rather, to tilt the test head from the first orientation to the second orientation, trunion assembly 305 is moved along curved path 120 (for example. in a circular manner) from the first orientation to the second orientation. Also, as shown in FIG. 1A, test head 110 is able to assume a third orientation in which the front of test head 110 is tilted downwards (and the rear of test head 110 is tilted upwards) so that test head 110 is rotated clockwise relative to the first orientation. This is accomplished by moving trunion assembly 305 to the third orientation. Again, because trunion assembly 305 can be moved in the manner shown, a cradle need not be provided along the sides of test head 110 and within which test head 110 rotates. Thus, the use of a cradle is optional and, in some situations, may be dispensed with altogether.

For purposes of this explanation, positioner system 115 includes trunion assembly 305 and base 125. Base 125 can be comprised of the components of any positioner system as is well known in the art. Exemplary base systems are described, for example, in U.S. Pat. No. 4,527,942. Base 125 being shown here is thus for illustrative purposes only. Furthermore, only a fragment of base 125 is shown. Trunion assembly 305 moves along a curved path 120 that can be defined within base 125 while base 125 remains stationary relative to trunion assembly 305.

Figure 1B:
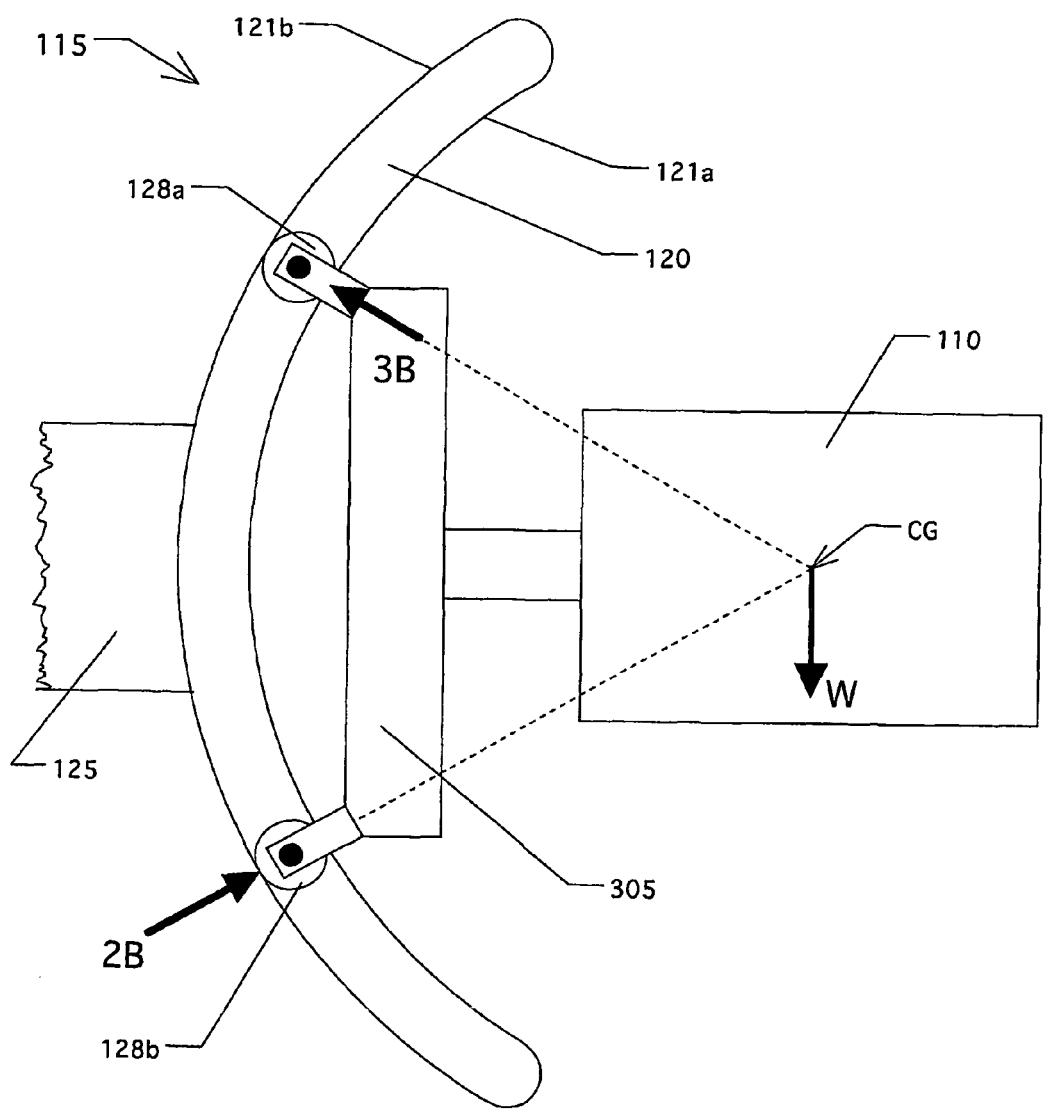
FIGS. 1B-1D are respective side views of exemplary embodiments of the present invention showing the test head in the various orientations shown in FIG. 1A and further showing forces acting on the test head.
Figure 1C:
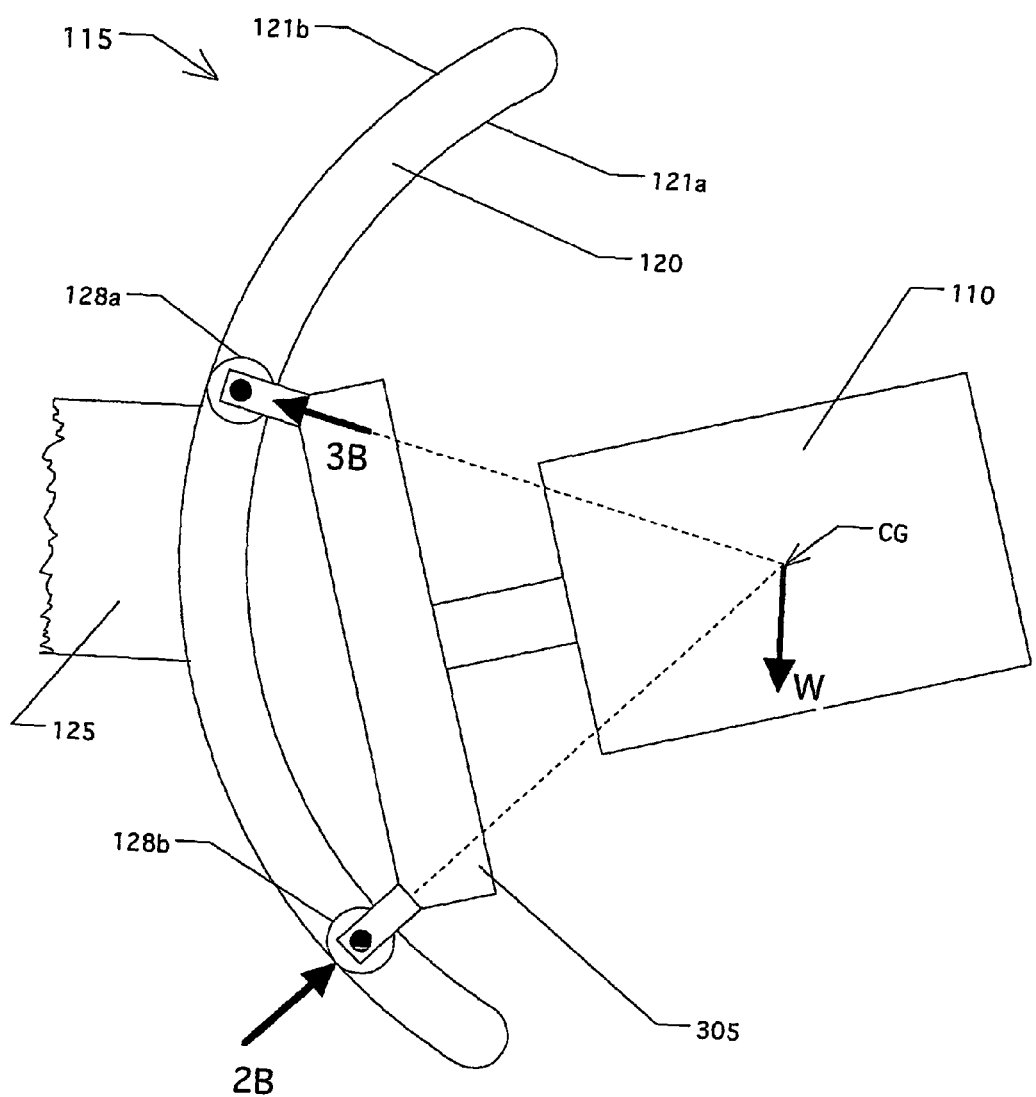
Figure 1D:
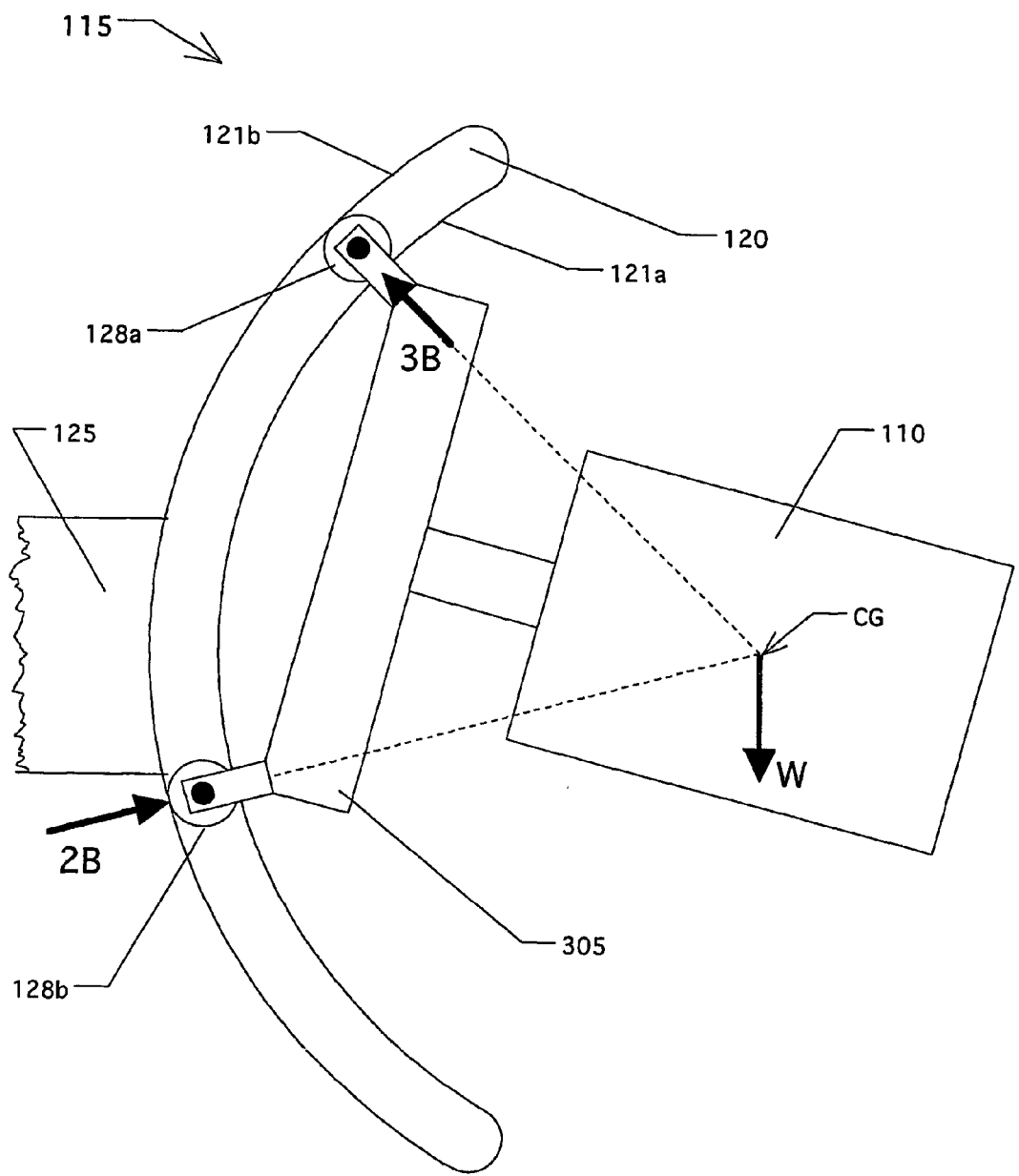

In FIG. 1A, wheel or cam followers 128a and 128b are spaced relatively close together in order to effectively illustrate the motion of the apparatus. In FIGS. 1B, 1C, and 1D a slightly modified conceptual embodiment is illustrated, where the wheels or cam followers 128a and 128b have been spaced further apart in order to better illustrate the forces acting on test head 110.

In FIGS. 1B, 1C and 1D, various forces acting on the test head are shown. In these figures and in a preferred embodiment to be described later, curved path 120 is an arc of a circle. (Further embodiments may incorporate curved paths which are not circular arcs as will be discussed later.) The arc is desirably in a vertical plane. The combined weight of the test head 110, trunion assembly 305 and wheels 128a and 128b is indicated by force arrow W acting at the center of gravity CG of the assembly. The system is desirably constructed with the center of gravity CG located at the center of concentric arcs 121a and 121b which form curved path 120. As shown, wheel 128a rides on inside arc 121a, and reaction force 3B acting on trunion 305 is directed radially outwards through the point of contact (or area of support) between wheel 128a (or another circular member) and arc 121a. This reaction force thus exists at an area of support between trunion 305 and base 125. Similarly, wheel 128b rides on outside arc 121b, and reaction force 2B acting on trunion 305 is directed radially inwards through the point of contact (or area of support) between wheel 128b and arc 121b. This reaction force also exists at an area of support between trunion 305 and base 125. It is seen that the two reaction forces 2B and 3B support test head 110 and necessarily pass through center of gravity CG. Because path 120 is an arc of a circle, this is true in all positions (where the test head is rotated less than plus or minus 90 degrees from the horizontal of FIG. 1B). Thus, there is no moment about the center of gravity CG of load 110. Accordingly, the only force required to rotate the test head is the force necessary to overcome the friction in the system. Further, test head 110 is in a state of static equilibrium in all positions.

It is understood that the two (or more) wheels 128a and 128b can be replaced with a single (or multiple) sliding member.

Thus, a pivoting joint is provided with the property that it allows a load to be rotated about a pivot axis that is at a remote location with respect to the movable points of contact of the joint. Such rotation of the load (in any orientation) is considered to be tilt of the load. Indeed, a surface which is everywhere parallel to the pivot axis can be inserted between the pivot axis and contact area between the movable parts of the joint. In addition, as has been described, the joint has the further property of being capable of supporting the load if the pivot axis is horizontal and passes through the load's center of gravity. This allows the load to pivot about the pivot axis with an externally applied force that is just sufficient to overcome the friction in the system. In this sense, the load is balanced with respect to the pivot axes just as it would be if it were supported by rotative bearings located on a horizontal line passing through the center of gravity. As a practical matter, it is difficult to construct a system such that reaction forces 2B and 3B pass exactly through center of gravity CG. Reaction forces 2B and 3B intersect at the center of rotation. Should the center of rotation not coincide exactly with the center of gravity, the load will nonetheless remain in a stationary position provided that the resulting moment about the center of gravity is not sufficient to overcome the static friction. If this is not the case, load 110 will tend to rotate in a direction so as to place the center of gravity CG underneath the center of rotation. As will be discussed, a practical embodiment may include an auxiliary force-supplying device to compensate for a center of gravity that is displaced from the center of rotation. A pivot joint with the properties just described may be referred to as a "remote axis pivot joint." For simplicity in this document the terms "wrist joint" or "wrist assembly"

may be used to refer to a joint which generally has the same or similar properties, although more precise terms and descriptors will be used when necessary.

Figure 2A:
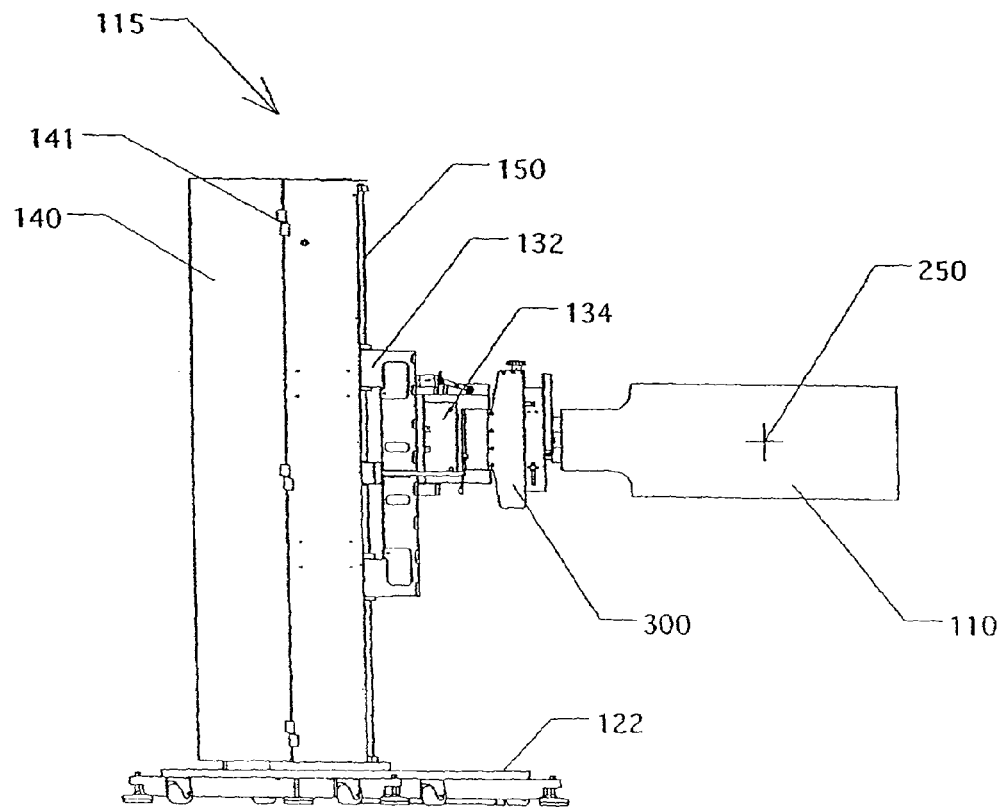
FIGS. 2A-2C are side views of a test head attached to a test head manipulator in various orientations according to an exemplary embodiment of the present invention.
Figure 2B:
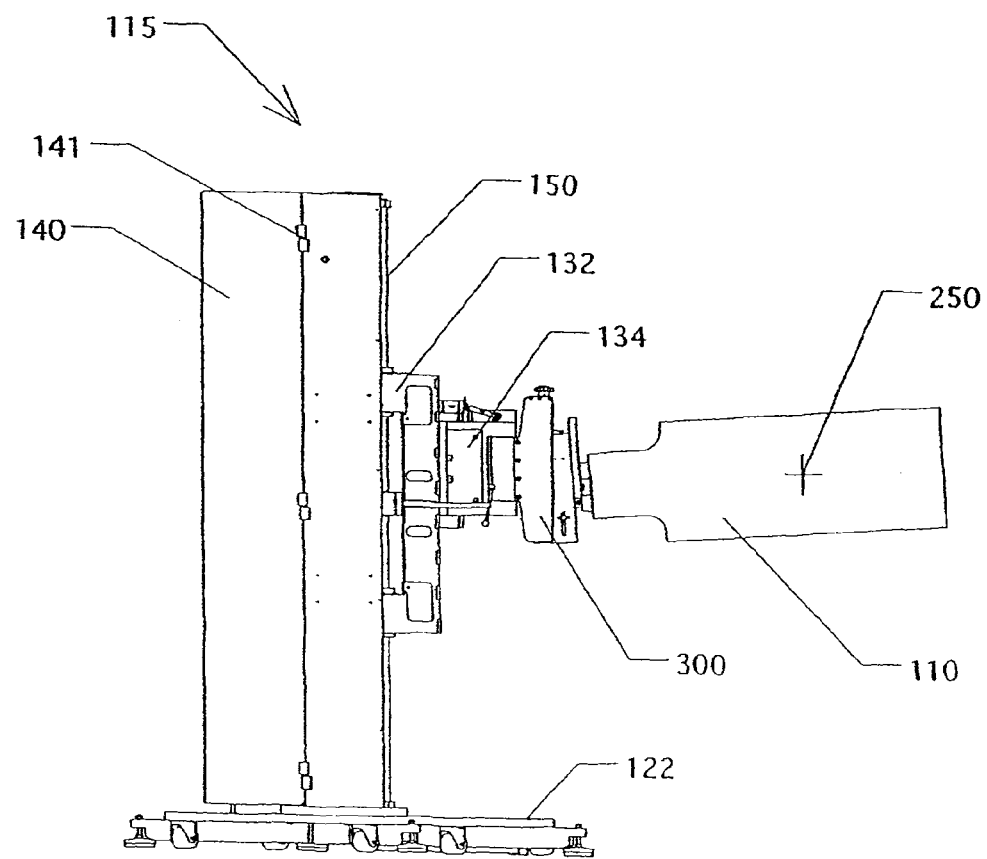

A practical embodiment of a wrist joint is described with the aid of FIGS. 2A through 9 and FIG. 18. A perspective drawing of a test head positioner incorporating a wrist joint is provided in FIG. 3. FIGS. 2A through 2C are side views of the system showing the test head in three different orientations due to motion of the wrist joint.

Figure 2C:
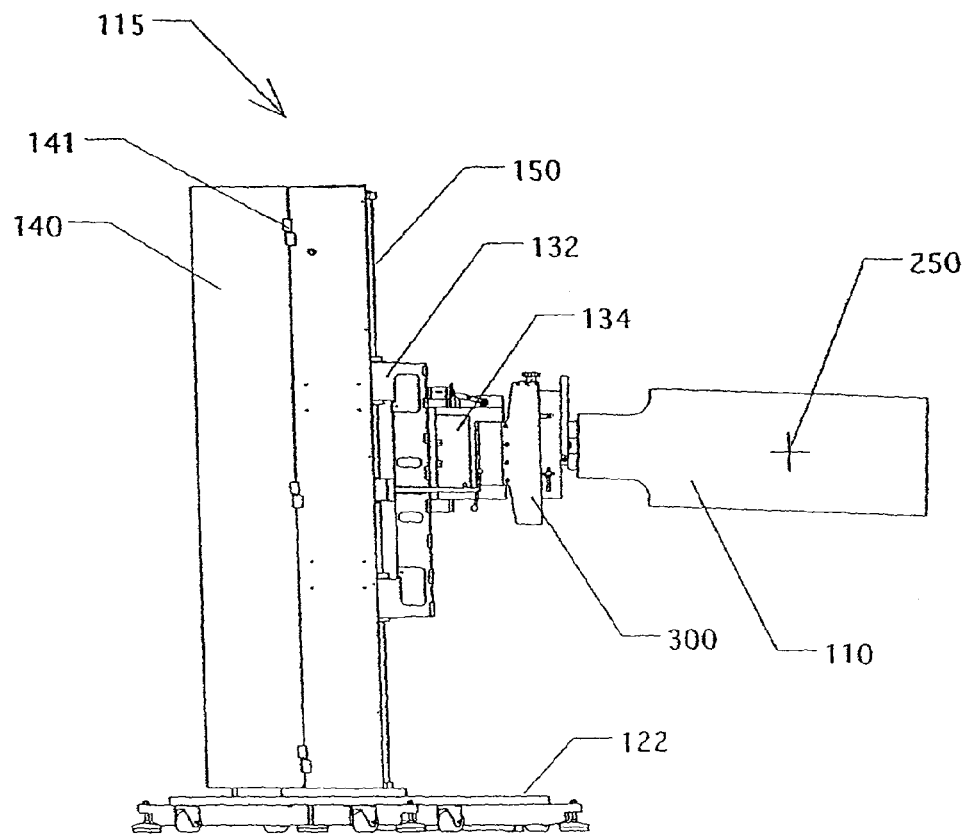

FIG. 2A shows test head 110 in a substantially horizontal position. By contrast, in FIG. 2B, test head 110 is pivoted similarly to the second orientation of FIG. 1A, i.e., about rotation axis 250. Conversely, as shown in FIG. 2C, test head 110 is pivoted similarly to the third orientation of FIG. 1A, again, about rotation axis 250.

Figure 3:
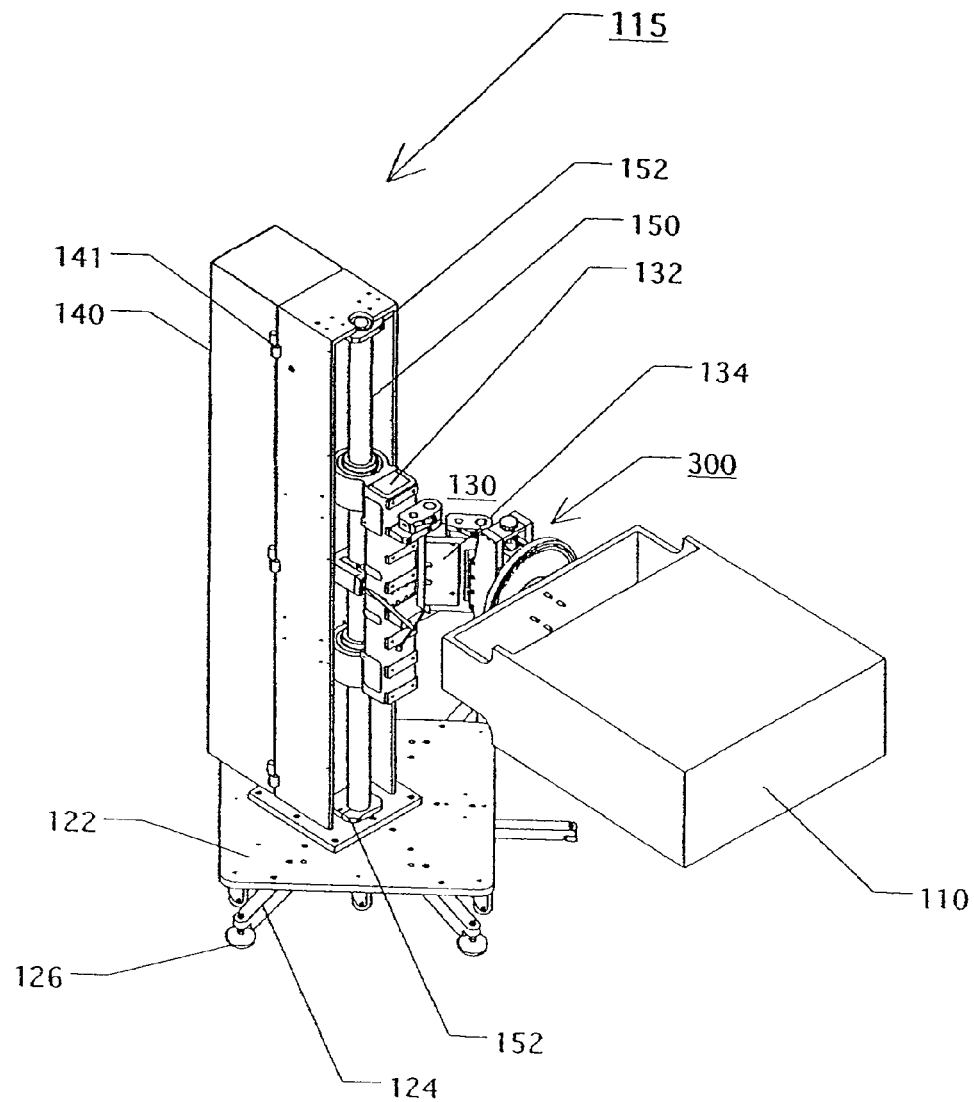
FIG. 3 is a perspective view of a test head attached to the positioner system of FIGS. 2A-2C.

FIG. 3 is a perspective view of test head 110 attached to positioner system 115. Test head 110 is attached to positioner system 115 via wrist assembly 300 in accordance with an exemplary embodiment of the present invention.

The various features of wrist assembly 300 are shown with reference to FIGS. 4 through 7, 8A through 8C, 9, and 18.

Figure 4:
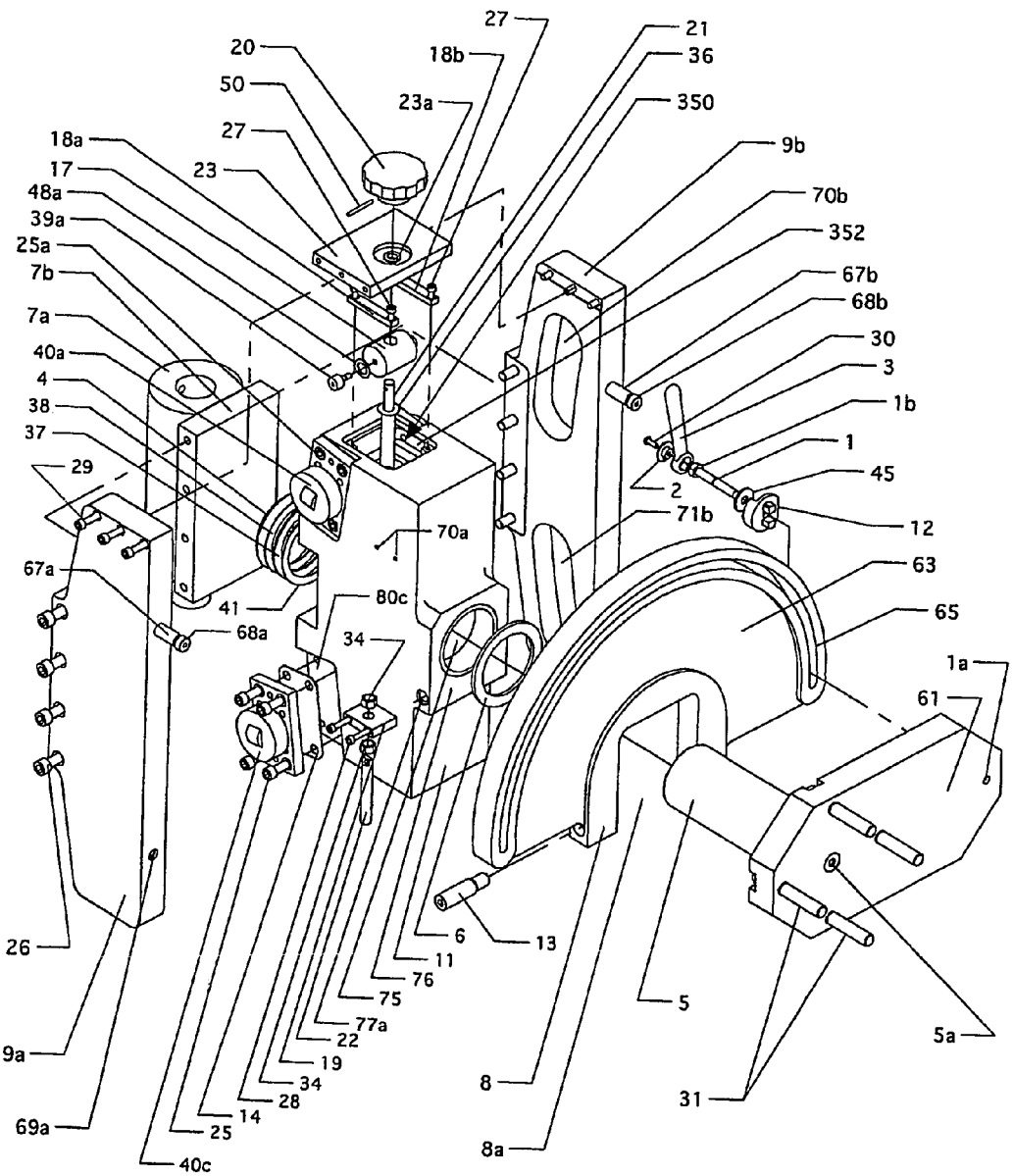
FIG. 4 is an exploded view of the manipulator joint used in the system of FIG. 3.
Figure 5:
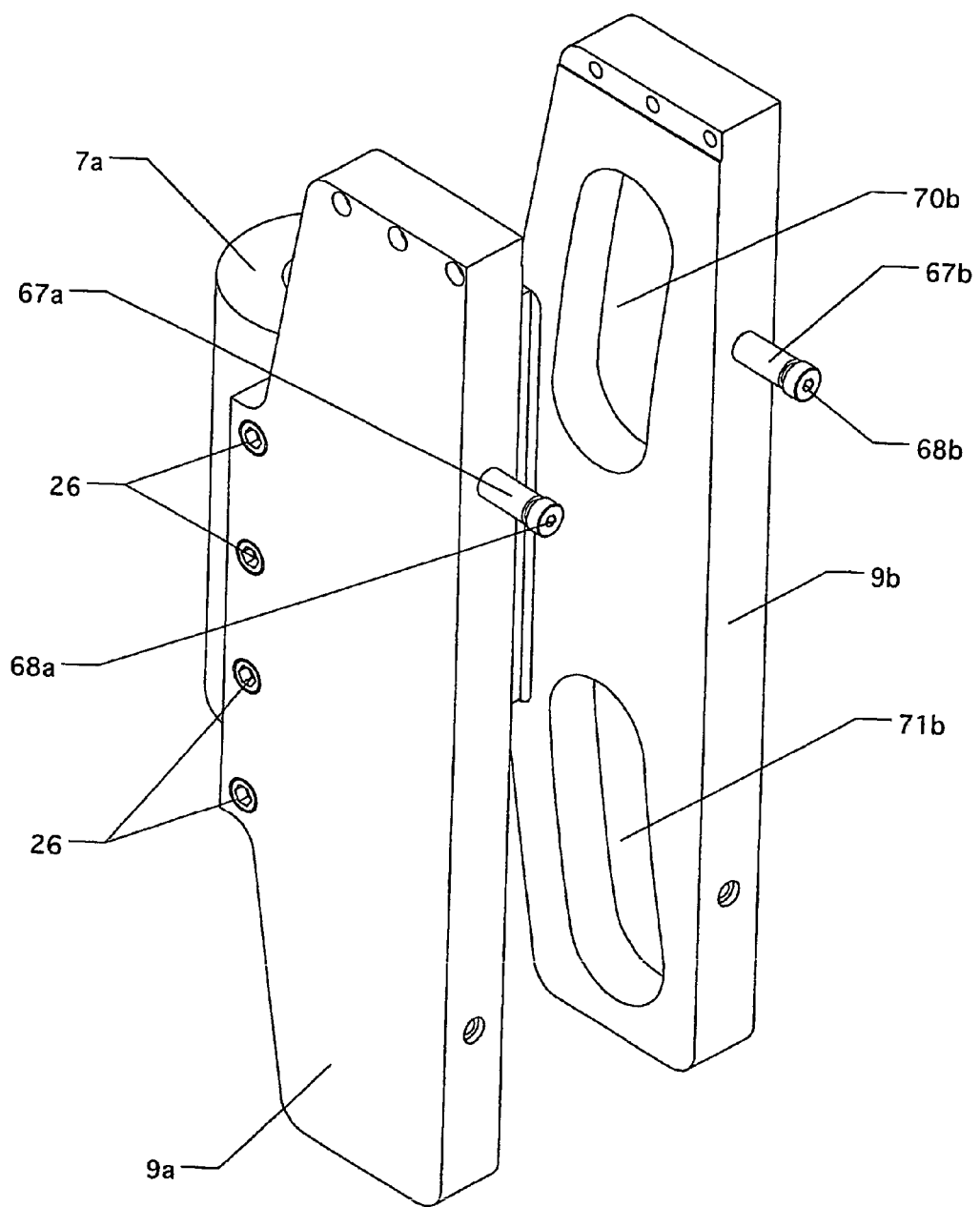
FIG. 5 is a perspective view of the guide plate and mounting plate which are included in the manipulator joint.

FIG. 4 is an exploded view showing the various components of the wrist assembly 300. As shown in FIG. 4 and FIG. 5, guide plates 9a and 9b are included. Guide plates 9a and 9b are affixed to respective sides of mounting plate 7b (not visible in FIG. 5) so that they project forward therefrom. Mounting plate 7b is itself attached to cylinder 7a. Cylinder 7a includes a hollow, cylindrical channel through which it is attached to the remainder of positioner system 115 by an appropriate cylindrical member (not shown). Thus, the cylindrical member (not shown) extends through the channel formed in cylinder 7a so that cylinder 7a is able to rotate about the cylindrical member.

Figure 6:
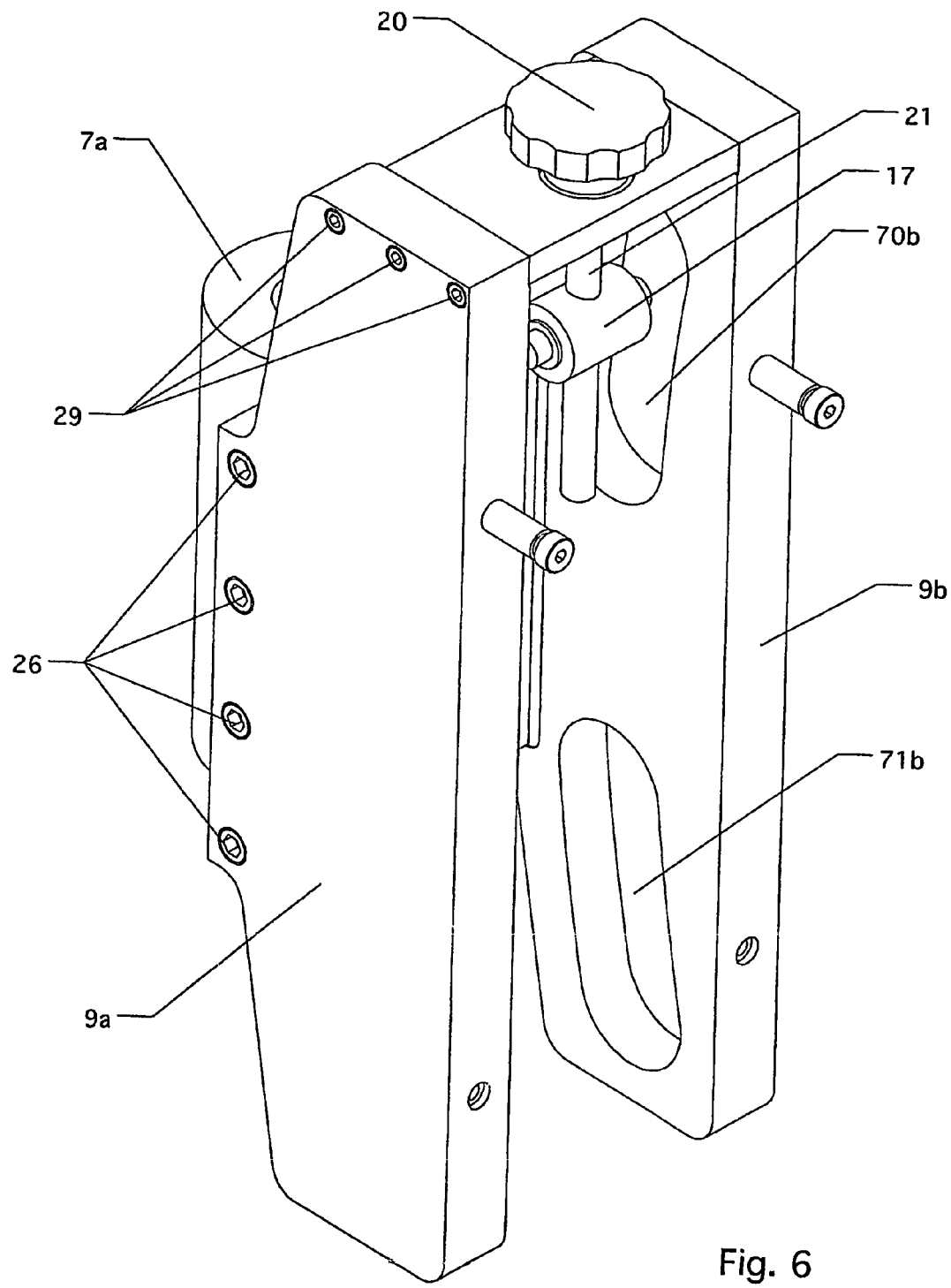
FIG. 6 is a perspective view which shows the guide plate and mounting plate of FIG. 5 and also shows the bearing plate and associated mechanical items.

Guide plates 9a and 9b may be attached to mounting plate 7b using, for example, attachment screws 26. Next, as shown in FIGS. 4 and 6, bearing plate 23 is attached to top portions of guide plates 9a, 9b using attachment screws 29. Bearing plate 23 includes an opening into which bearing 23a is placed. Shaft member (e.g. screw) 21 extends through bearing 23a and is attached to knob 20 using roll pin 50. The end of screw 21 that extends through bearing 23a is stepped with the small diameter fitting closely within bearing 23a. Washer 36 may be placed on the small diameter portion of screw 21 below bearing plate 23, and it is retained in position by the step. Special adjustment nut 17 is included. Adjustment nut 17 includes a threaded opening. Thus, screw 21 extends through (and engages) the threaded opening in adjustment nut 17, then through bearing 23a, and is then attached to knob 20. On each side of adjustment nut 17, flat washers 48a,b and cam followers 39a,b are included. (Note: 39b and 48b are not visible in FIGS. 4, and 48b is not visible in FIG. 6.) The function of cam followers 39a,b will be described later.

Figure 7:
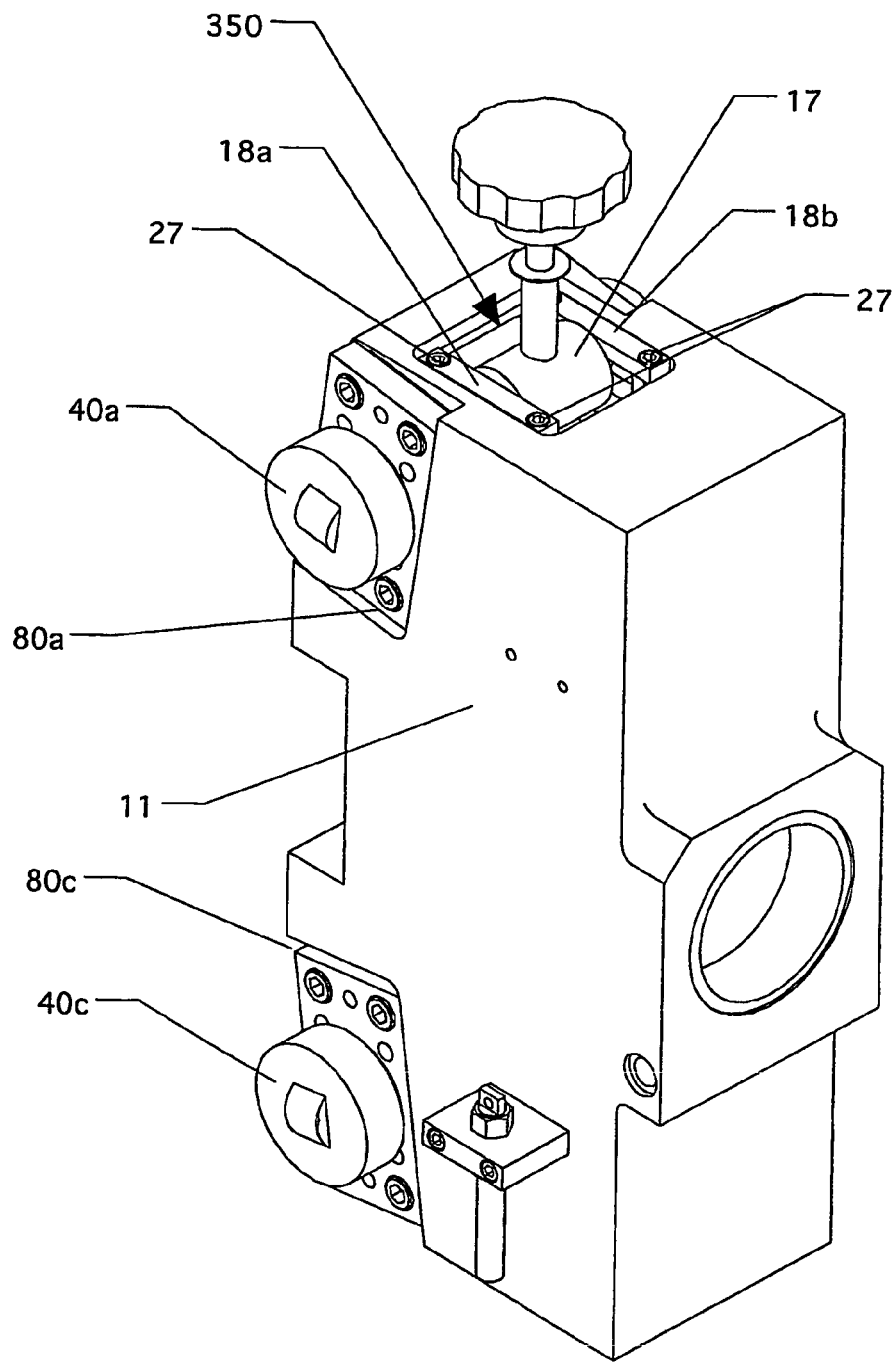
FIG. 7 is a perspective view of the housing.
Figure 8C:
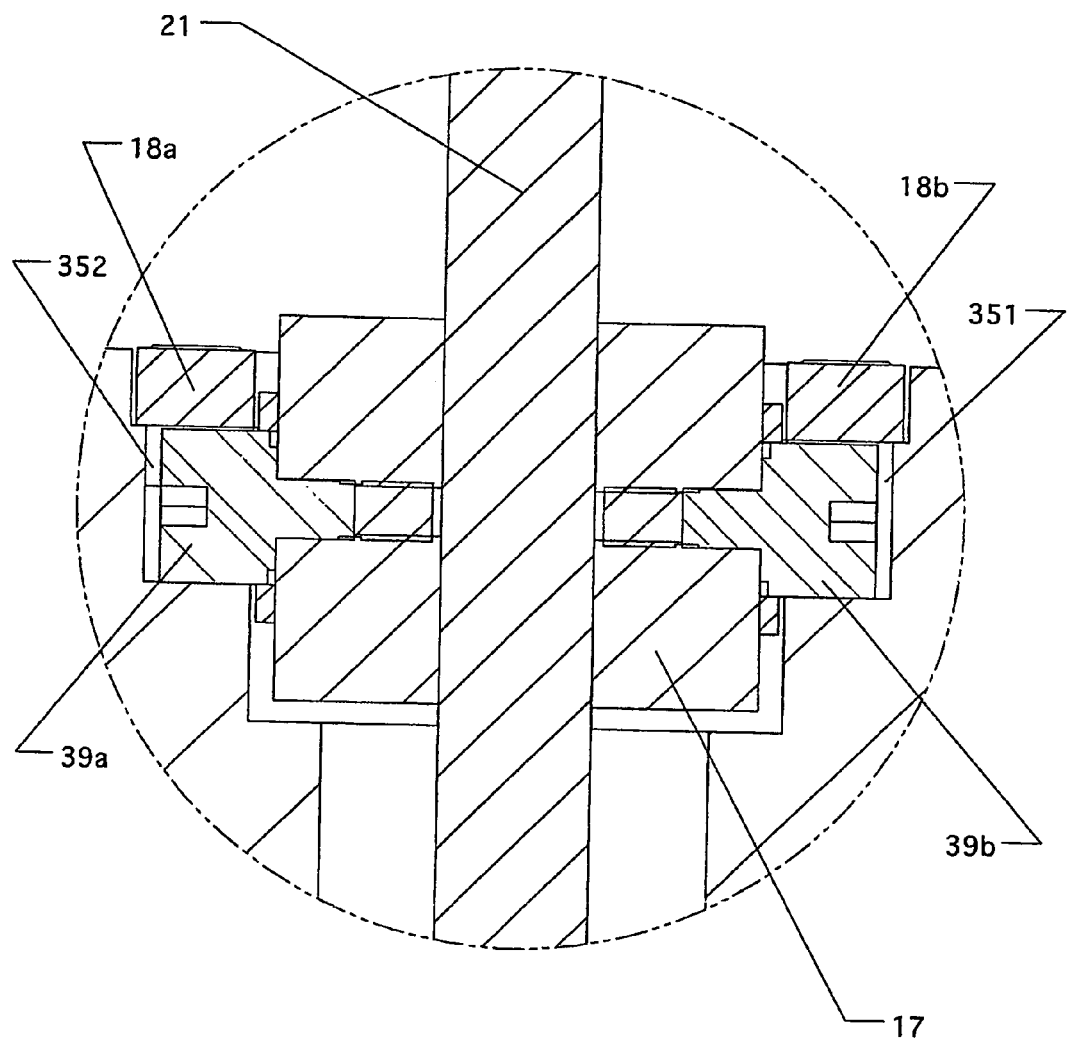
FIG. 8C is an enlarged view of a portion of FIG. 8B.

From FIGS. 4 and 7, it is seen how adjustment nut 17 is coupled to wrist housing 11. Specifically, horizontal grooves or channels 351 (not visible) and 352 are included in opening 350 of wrist housing 11. Cam followers 39a, b are situated therein and are able to move back and forth within those grooves. Channel covers 18a,b hold Cam followers 39a, b within channels 351 and 352. After cam followers 39a, b are inserted in those grooves, adjustment nut caps 18a, b are placed on top, and they are held in place using attachment screws 27.

As shown in FIGS. 4 and 7, track roller assemblies 40a, b, c, d, are included (40b and 40c are not visible). Track roller assemblies 40a-d are attached to wrist housing 11 at respective cutouts 80a, b, c, d. Track roller assemblies 40a-d may be attached to respective cutouts 80a-d via spacers 14 (not visible in FIG. 7). An exemplary track roller assembly is a combined bearing system manufactured by Pacific Bearing of Rockford, Ill. (exemplary part number HVB-053). Alternatively, each track roller assembly or bearing system can be replaced with a pair of bearings or cam followers, one orthogonal to the other.

Figure 9:
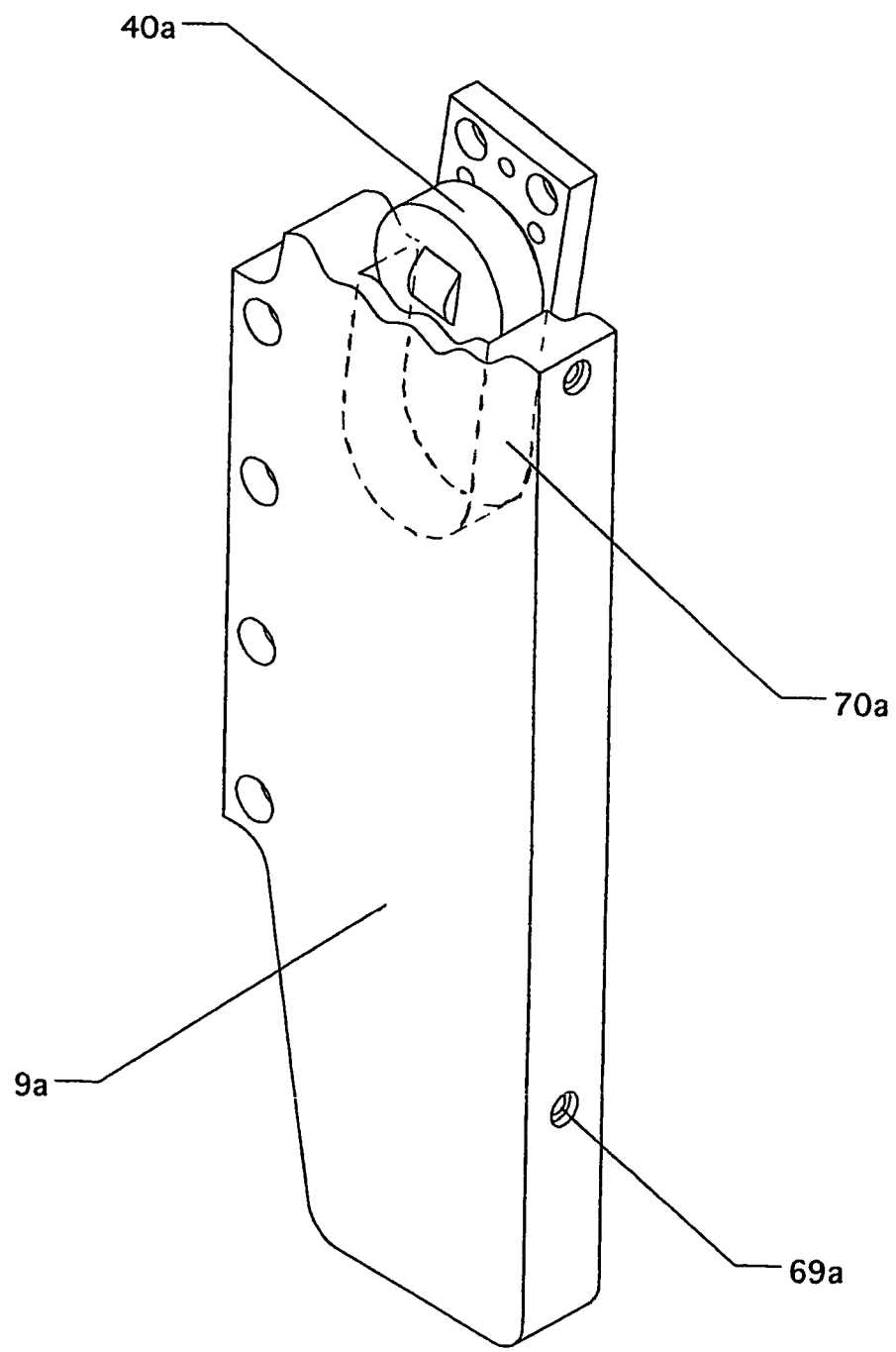
FIG. 9 is a cut-away view showing how the cams engage the tracks in the guide plate.

The manner in which wrist housing 11 is coupled to guide plates 9a, b is now more fully described with reference to FIGS. 4, 8A, 8B, 8C and 9. Each guide plate 9a, 9b includes respective cutouts 70a, 71a, 70b, 71b. Each track roller assembly 40a, 40b, 40c, 40d glides within respective cutouts 70a, 71a, 70b, 71b. Cutouts 70a, 71a, 70b, 71b are arcs of a circle in an exemplary embodiment. Track roller assemblies 40a-d thus move along circular paths, where the center of the circle is the center of rotation of the test head. Thus, as shown in FIG. 9, track roller assembly 40a is able to glide within cutout 70a. This relationship between the track roller assemblies 40a, b, c, d and cutouts 70a, b, 71a, b is also shown in cross section in FIG. 8B. Furthermore, while bearing plate 23 is attached to guide plates 9a, 9b, cam followers 39a, b are attached to wrist housing 11 by virtue of being contained within the channels 351, 352 and channel covers 18a, b attached above channels 351, 352.

One way to tilt the test head is by turning knob 20. As knob 20 rotates, screw 21 also rotates. In one exemplary embodiment of the present invention, knob 20 does not move vertically relative to bearing plate 23. Thus, as screw 21 turns, adjustment nut 17 moves along the threads of screw 21. As knob 20 is turned, adjustment nut 17 moves towards or away from knob 20. Furthermore, as adjustment nut 17 moves towards or away from knob 20, wrist housing 11 with its track roller assemblies 40a,b,c,d move along track cutouts 70a,b 71a,b. In this manner, test head 110 tilts. Thus the mechanism allows the load to be rotated manually to any angular position within the range allowed by the mechanism's designed range of motion. Further, it is understood that knob 20 may be replaced or augmented by a motorized drive that could provide remotely controlled or automated positioning. In such a driven application, balance may not be necessary; and, consequently, the center of rotation may be placed at a location other than the load's center of gravity, which may be advantageous to a specific application.

In an alternative embodiment of the present invention, the distance between the top of thrust washer 36 and the bottom of knob 20 is greater than the thickness of bearing plate 23. Thus, bearing plate 23 is able to move along that space. This allows small amounts of movement between wrist housing 11 and guide plates 9a,b. In other words, one can use ones hand to slightly move wrist housing 11. This is useful for compliance. Thus, the adjustment mechanism, comprising bearing plate 23, screw 21, adjustment nut 17, and related hardware. may be used to first manually adjust the angle of the load to the approximate angle required for docking with its target peripheral. Then as the docking mechanism is actuated, the test head may rotate compliantly as necessary to arrive at its final, precise docked position.

Although the above exemplary embodiment includes the adjustment mechanism comprising bearing plate 23, screw 21, adjustment nut 17 and related hardware, these items may be deleted, particularly if the test head is rotating about it's center of gravity. Alternatively, the adjustment mechanism shown may be replaced with a different adjustment mechanism which provides control of the movement of test head 110.

Of course, if the adjustment mechanism is removed, then wrist housing 11 can be moved within guide plate 9a,b with hand pressure or some other external force. In this way, test head 110 is tilted by hand.

Also, as shown in FIG. 4, posts 67a,b and post ends 68a,b, mounted on guide plate 9a,b respectively, may be included. An adjustment screw 22 is mounted on each side of wrist housing 11 by means of bracket 19 and mounting screw 28. Screw 22 is threaded through two nuts 34, one on each side of bracket 19, to enable the position of screw 22 to be adjusted. Springs may be attached between posts 67a,b and screws 22. In FIG. 4, only one screw 22 is shown. Screw 22 includes a small opening, which receives one end of a spring (not shown). The other end of that spring is attached to post 67a. The spring on the other side of wrist housing 11 which would be attached to post 67b is also not shown. In practice, screw 22 engages threads in nuts 34 situated above and below spring anchor block 19. Thus, by rotating screw 22, screw 22 moves up and down within spring anchor block 19. In this way, the spring which is coupled between screw 22 and post 67a can be stretched and compressed to adjust the force that it applies. The use of springs is helpful particularly when the center of gravity of the test head and the axis about which the test head rotates do not coincide. The spring force may be adjusted so that when the load is in a desired nominal position, the moment about its center of gravity is zero, thus providing a state of static equilibrium as well as a state in which it can be rotated with relative little force. As shown, posts 67a,b can be relocated to openings 69a,b; and spring anchor blocks 19 and associated items can correspondingly be relocated to mounting holes 70a,b. This is useful for providing downward spring force (instead of the upward spring force provided by the illustrated position of posts 67a,b) when the offset between the center of gravity and the axis of rotation so requires.

Figure 18:
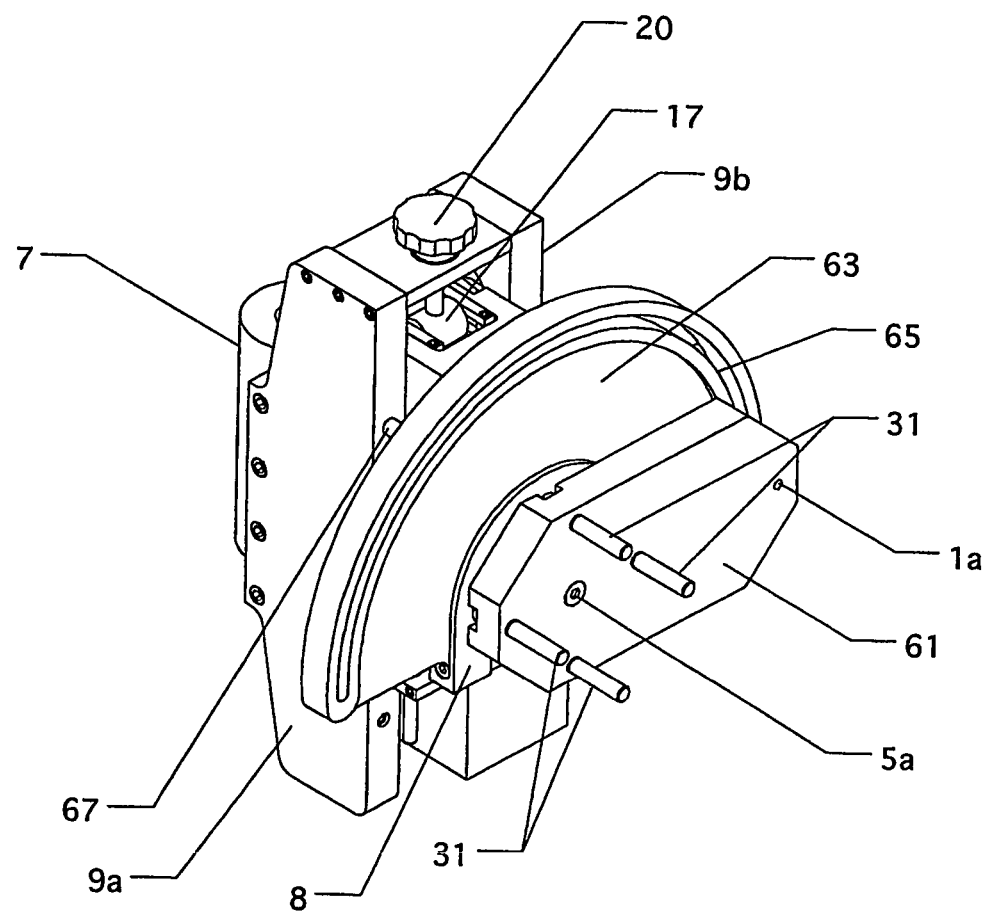
FIG. 18 is a perspective view showing the roll lock plate and the test head mounting plate in accordance with the exemplary embodiment shown in FIGS. 2A-2C, 3, and 4.

As shown in FIG. 18, roll lock plate 63 is attached to the front of wrist housing 11. Roll lock plate 63 and test head mounting plate 61 are also shown in FIG. 4. Test head mounting plate 61 is attached to the test head 110 via bolts 31. Alternatively, another spacing structure (not shown) may be placed between test head mounting plate 61 and the test head. Lock plate 63, roll plate 61, and associated items are all part of the load that is rotated by wrist 300, and they must be combined with test head 110 when determining the center of gravity. Wrist shaft 5 may be fitted to test head mounting plate 61. Wrist shaft 5 extends through thrust bearing 6 and opening 75 in wrist housing 11. Wrist shaft 5 then extends through the rear of wrist housing 11 and is then coupled to shims 41 and shaft retainer 4. In this manner, test head mounting plate 61 is able to rotate about an axis that is essentially orthogonal to the axis of rotation provided by the motion of the wrist joint. Screw 5a goes through test head mounting plate 61 and engages wrist shaft 5 to facilitate attachment of wrist shaft 5 to test head mounting plate 61. Also, as shown in FIG. 4, lock bolt 1 extends through opening 1a in test head mounting plate 61 and lock slot 65 in roll lock plate 63. By actuating wrench 3, handle stop 12 pulls test head mounting plate 61 towards roll lock plate 63 in order to fix the position of test head mounting plate 61 relative to roll lock plate 63.

Figure 10A:
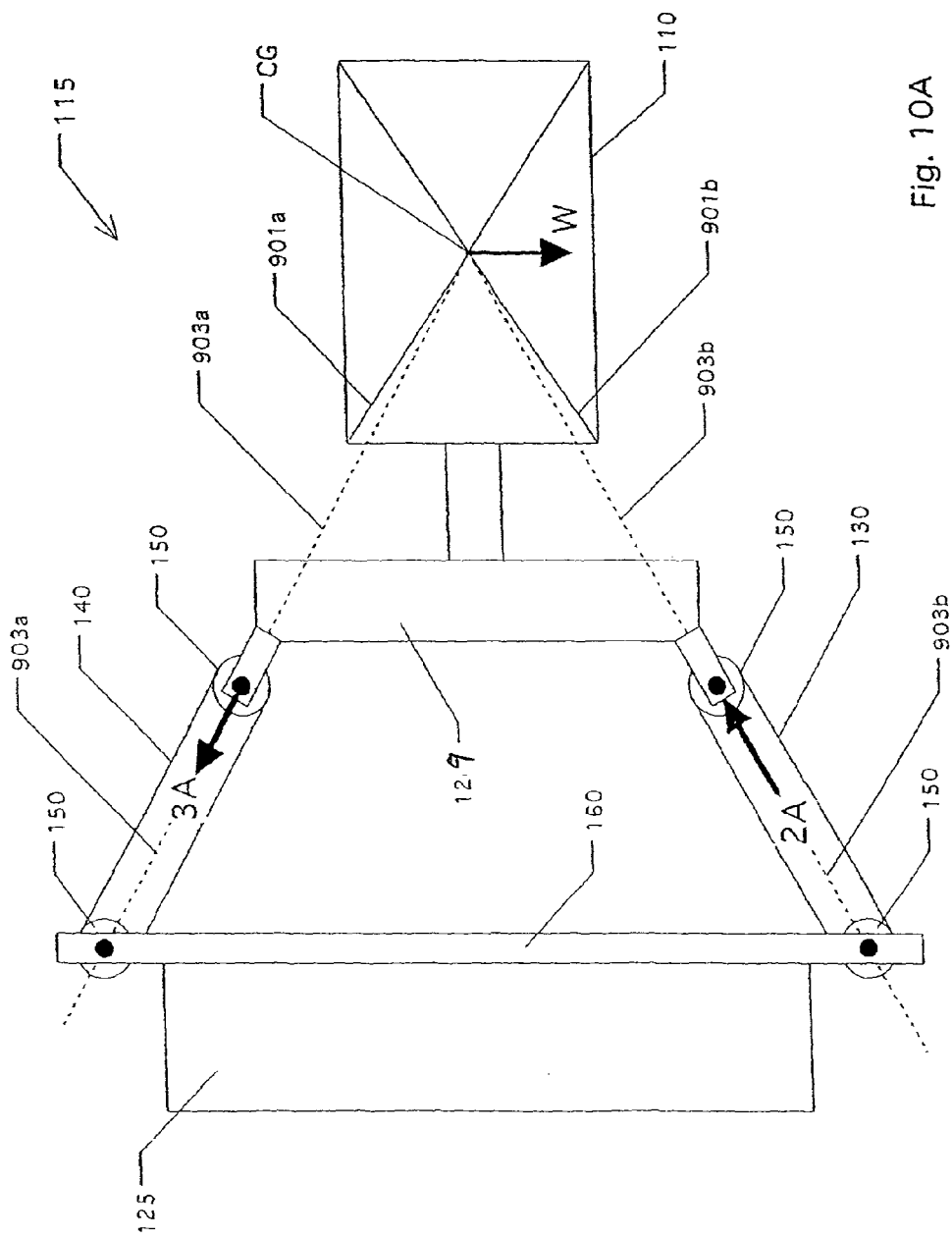
FIG. 10A is a side view of a test head in accordance with a further exemplary embodiment of the present invention.

A further exemplary illustrative embodiment of the present invention is shown in FIG. 10A. This embodiment also includes test head 110 coupled to positioner 115 by a pivoting joint mechanism (or "wrist joint") 310, which replaces the previous wrist joint 300. Positioner 115 again includes base 125 to which ground link 160 has been attached. In practice ground link 160 may actually be an integral part of base 125. Again, only a portion of base 125 is shown. Wrist joint 310 includes lower pivot link 130 and upper pivot link 140 which extend from ground link 160. Lower pivot link 130 and upper pivot link 140 are each rotatively coupled to ground link 160 via bearings 150. By virtue of being attached to ground link 160 via bearings 150, lower pivot link 130 and upper pivot link 140 are able to rotate towards and away from ground link 160.

Lower pivot link 130 and upper pivot link 140 are rotatively attached to load carrying link 120 via additional bearings 150. Thus, as a result of lower pivot link 130 and upper pivot link 140 rotating upwards and downwards, load carrying link 120 is able to move. As shown in this illustrative embodiment, test head 110 is rigidly coupled to load carrying link 120. Load carrying link 129 serves essentially the same function as trunion 300 of the embodiments described in FIGS. 1A-D. (In practice, mechanisms to provide additional motions, such as roll motion, may be placed between load carrying link 129 and test head 110.)

The configuration in FIG. 10A is in a state of static equilibrium as will now be described. The forces acting on the load (test head 110) are its weight, indicated by arrow W, acting at the center of gravity CG and the reactions indicated by arrows 2A and 3A acting on load carrying link 129 transferred respectively from pivot links 130 and 140 by way of coupling bearings 150. The intersection of reference lines 901a and 901b is used to indicate an exemplary center of gravity CG. Dashed reference line 903a is defined by the centers of the two rotative bearings 150, which couple pivot link 140 to ground link 160 and load carrying link 129. Similarly, dashed reference line 903b is defined by the centers of the two rotative bearings 150 which couple lower pivot link 130 to ground link 160 and load carrying link 129. Inasmuch as pivot links 130 and 140 are effectively pinned at each end by bearings 150, reactions 2A and 3A act in directions along their respective links 130 and 140. That is, in the configuration of FIG. 10A, reactions 2A and 3A are applied to load carrying link 129 in the directions defined by reference lines 903b and 903a respectively. (For convenience and ease of explanation, the center of gravity is shown at the center of test head 110. In practice the center of gravity will be located elsewhere as the effect of supporting structures and cables must be taken into account.) It is observed that upper pivot link 140 is in tension and provides a force 3A, which is upwards and to the left; whereas, lower pivot link 130 is in compression and provides a force 2A, which is upwards and to the right. It is further noted that the apparatus is arranged so that reference lines 903a and 903b intersect at center of gravity CG. Thus, just as in the apparatus of FIGS. 1A-D, if test head 110 is situated as shown, then all forces (in this case 2A, 3A, and W), acting on the load (test head 110) pass through the center of gravity CG. Accordingly, there is no moment about the center of gravity, and test head 110 will not rotate unless an external moment-generating force is applied. It may further be readily observed that the system is statically determinate so that the horizontal and vertical components of all forces for translational static equilibrium are uniquely determined.

Figure 10B:
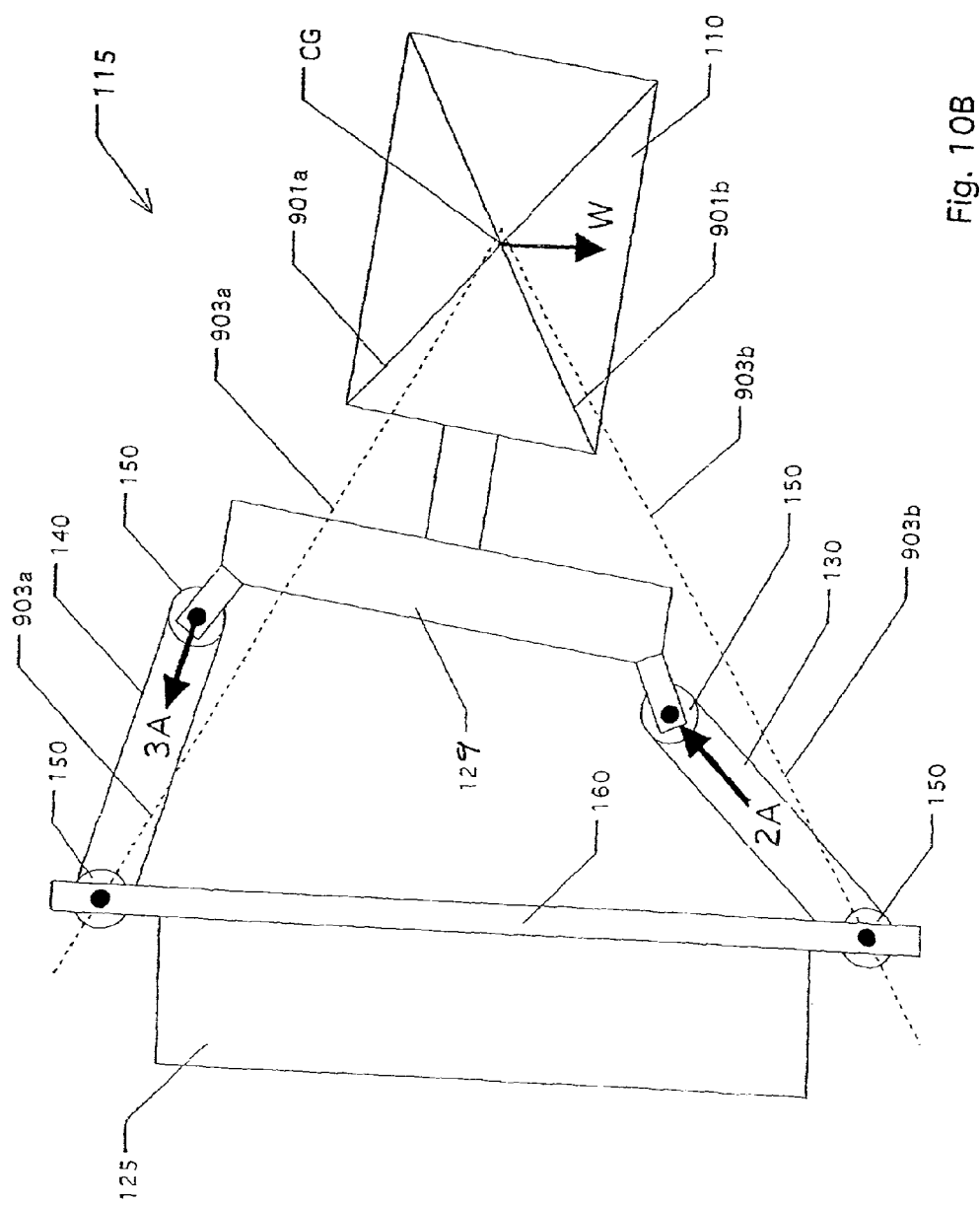
FIGS. 10B and 10C illustrate the test head of FIG. 10A in various orientations.

In the configuration shown in FIG. 10B, lower pivot link 130 and upper pivot link 140 have rotated counterclockwise relative to the position shown in FIG. 10A. As a result of this rotation, test head 110 has rotated clockwise relative to the position of test head 110 shown in FIG. 10A. Reference lines 903a,b are in the same position if FIG. 10B as they are in FIG. 10A. Thus, it is observed that in the process of rotating, test head 110 has also undergone a slight translational movement. FIG. 10D provides a magnified view showing the resulting translation of center of gravity CG away from the intersection of reference lines 903a,b. Thus it is seen that the center of gravity CG of test head 110 is no longer at the intersection of reference lines 903a,b. Put another way, the center of gravity moved slightly from its initial position. The amount of displacement depends upon geometric factors, such as the lengths and ratios of lengths of links 129, 130, 140, 160.

Furthermore, the reaction forces 2A and 3A must act in the directions defined by pivot links 130 and 140 respectively. Thus, as may be seen, reactions 2A and 3A no longer act along paths which pass through the center of gravity. It is seen, however, that the reactions 2A, 2B act in directions along paths so as to cause at least partially offsetting moments about the center of gravity. Consequently, a residual torque about the center of gravity is developed. The amount and net direction of this torque depends upon the angle of rotation and geometry of links 129, 130, 140, and 160. (An example is provided later.)

Figure 10C:
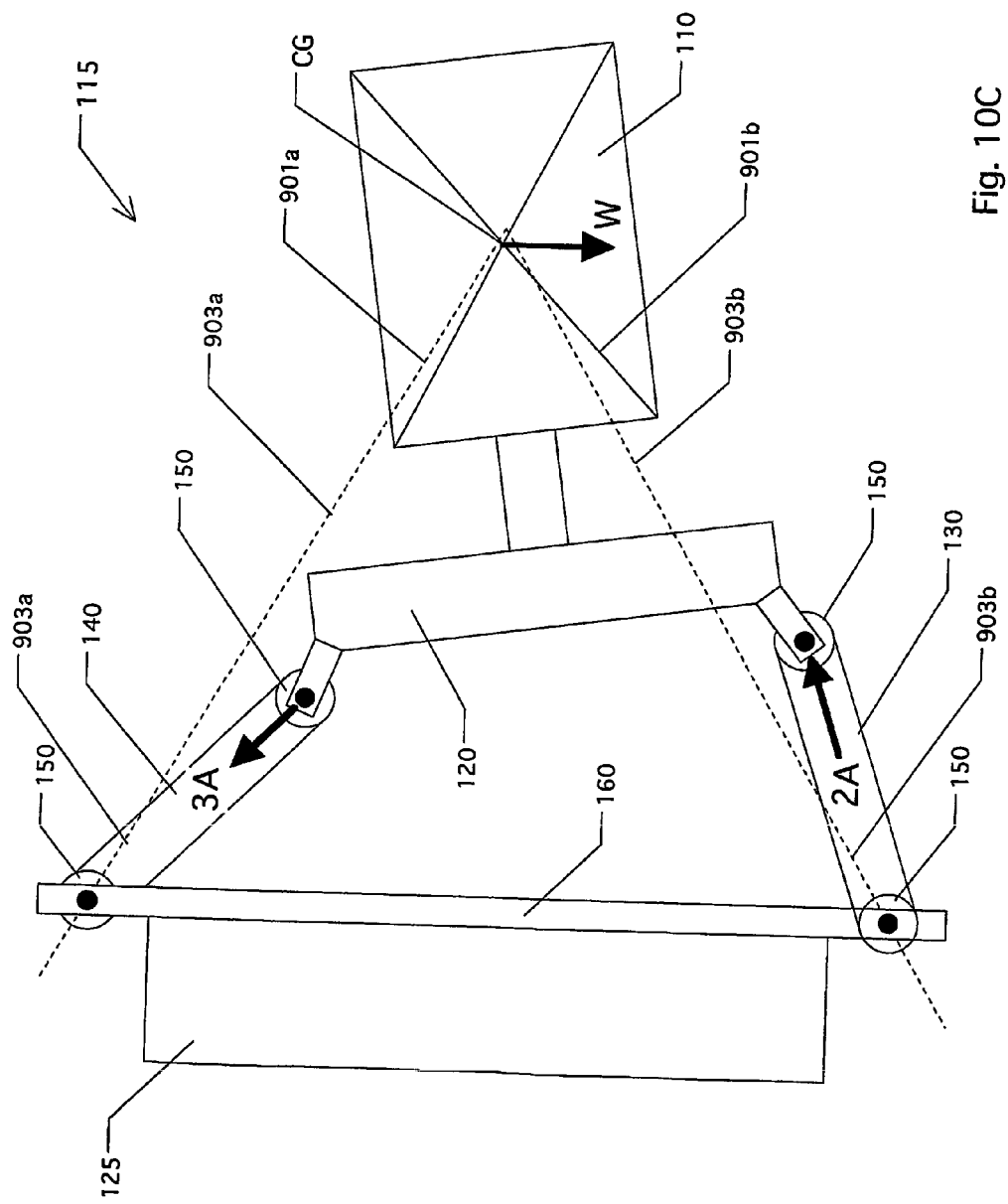
Figure 10D:
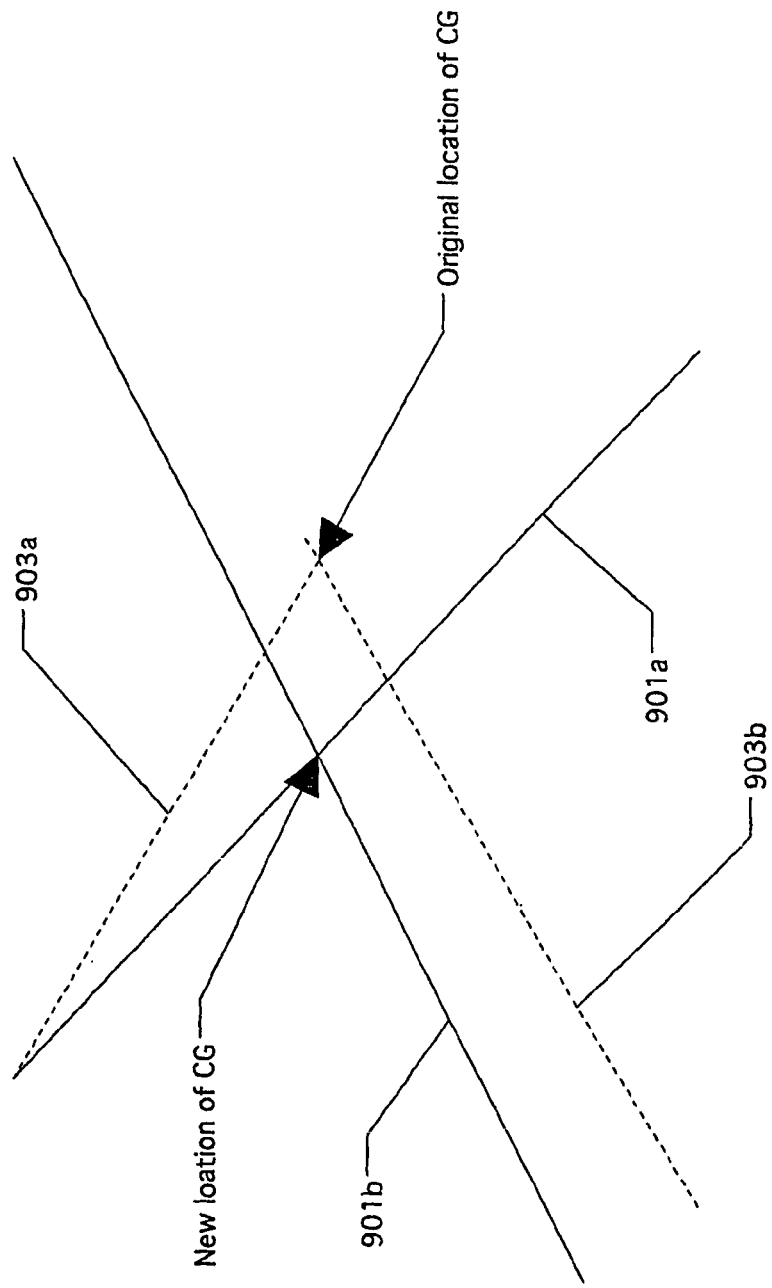
FIG. 10D is a diagram illustrating how the center of gravity of the test head of FIG. 10A is moved by rotating the test head.

In the further configuration shown in FIG. 10C, lower pivot link 130 and upper pivot link 140 have been rotated clockwise relative to the position shown in FIG. 10A. This results in the position of test head 110 rotating counterclockwise relative to the position shown in FIG. 10A. Again, as test head 110 has rotated the center of gravity CG has moved slightly as it did in FIG. 10B, thus, the center of gravity CG is no longer situated at the intersection of reference lines 903a,b of FIG. 10A; the situation is again as illustrated in FIG. 10D.

It is also seen in FIG. 10C that, as was the case in FIG. 10B, reactions 2A and 3A do not act along lines which pass through center of gravity CG. They again act in directions so as to cause moments acting in opposite directions about center of gravity CG, at least partially offsetting one another. Consequently, a residual torque is again developed about the center of gravity CG. The amount and direction of this torque depends upon the angle of rotation and geometry of links 129, 130, 140, and 160.

In an exemplary embodiment of the present invention, the pivot links 130 and 140 are each 11 inches, ground link 160 is 18 inches, and load carrying link 120 is 13 inches (distances measured from center to center of bearings 150). Through at least the first 3 to 5 degrees of rotation in either direction in this embodiment, the residual torque is small in comparison to the applied torque desirable to rotate test head 110. Thus, the test head is in a substantially weightless state with respect to this rotation. Furthermore, the residual torque is in a direction to restore test head 110 to its nominal position. That is to say if test head 110 is rotated up to 3 to 5 degrees clockwise a residual torque in the counterclockwise direction is produced and conversely. In many applications this is a desirable effect in that the load tends to return, or spring back, to its nominal position when the applied rotating force is removed. However, further rotation beyond a certain point may result in a reversal in the direction of the residual torque causing test head 110 to continue rotating away from the nominal position on its own accord. However, plus and minus 3 to 5 degrees of compliant rotation is sufficient for docking applications, and stops may be readily added to the system to prevent further rotation.

Just as was the case with the remote axis pivot joints illustrated in FIGS. 1A-1D, the remote axis pivot joint described in 10A-10D requires that forces 2A and 3A act along lines that pass close enough to center of gravity CG so that the developed torque is insufficient to overcome friction. It is generally difficult to construct a practical system to such a specification. A practical system may include auxiliary adjustable sources of force, such as adjustable length springs or pneumatics (as for example described in international application WO 02/25292 A2), to provide a balanced state.

Thus, FIGS. 10A-10D illustrate a remote axis pivot joint with properties similar to those of the remote axis pivot joints previously described. In comparison to the embodiment illustrated in FIGS. 1A-1D, the embodiment of FIGS. 10A-10D may provide a residual torque when the load is rotated and may also cause a slight movement in the center of gravity of the load as it is rotated. It is noted that if curves other than circular arcs are employed in the joints illustrated in FIGS. 1A-1D, similar properties could be manifested.

Figure 11:
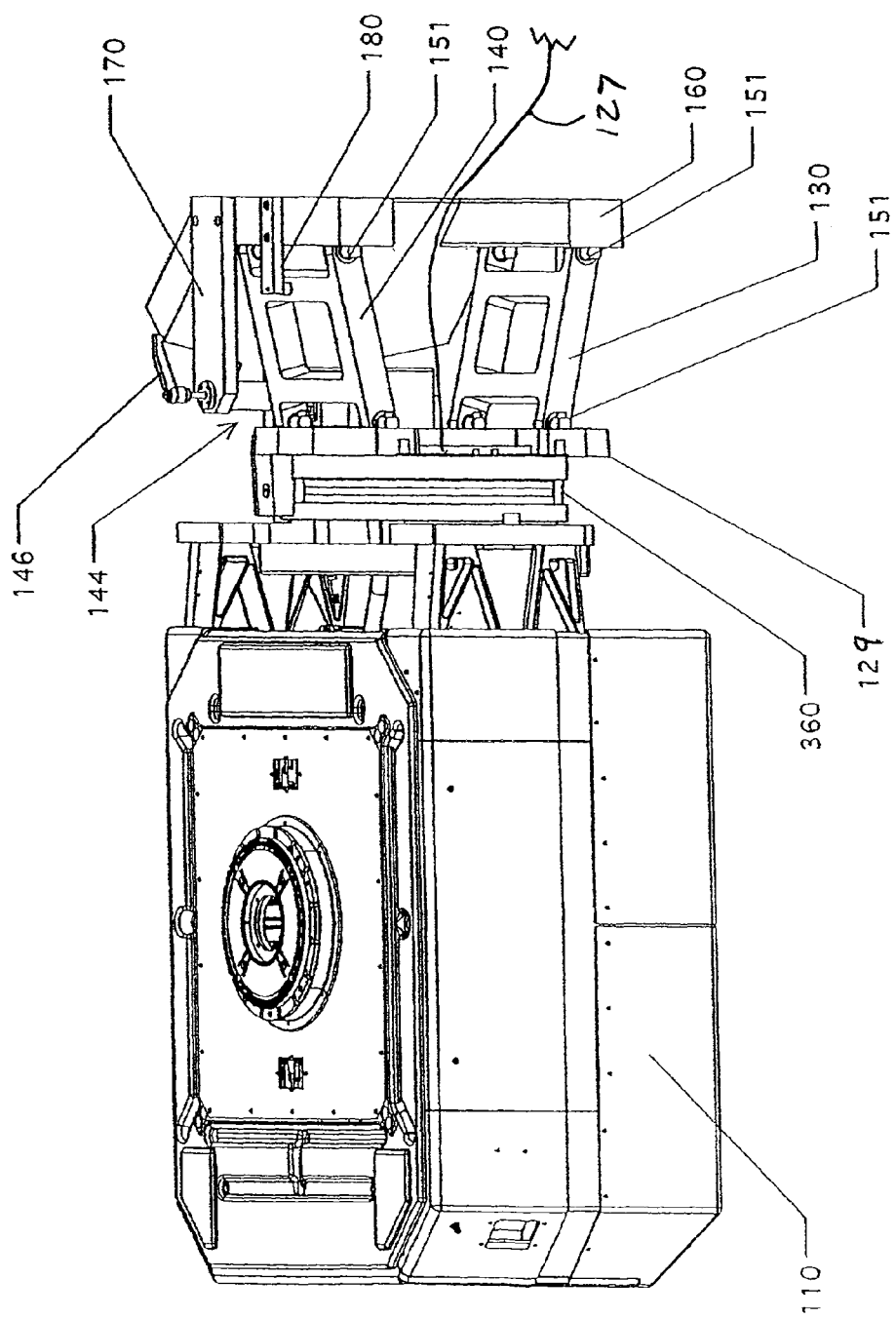
FIG. 11 is a perspective view of a test head and positioner system in accordance with the further exemplary embodiment of the present invention.

A side perspective view of a further practical exemplary embodiment of the present invention is shown in FIG. 11. Test head 110 is rotatively coupled to load carrying link 120. The coupling between test head 110 and load carrying link 120 may be accomplished using cable pivot assembly 360. The load in this case is thus test head 110 combined with cable pivot assembly 360. Exemplary cable pivots are described in U.S. Pat. Nos. 5,608,334 and 5,030,869. The '334 patent describes a single-piece cable pivot, and the '869 patent describes a split-ring cable pivot. The split ring design allows a test head to be attached to the system without disconnecting the cable 127 that connects it to a cabinet. Load carrying link 129 is coupled to lower pivot link 130 and upper pivot link 140. Lower pivot link 130 and upper pivot link 140, in turn, are coupled to ground link 160. Lower and upper pivot links 130,140 are rotatively coupled to load carrying and ground links 129,160 with pivot bearings 151. The pivot links 130 and 140 are each 11 inches, ground link 160 is 18 inches, and load-carrying link 129 is 13 inches (distances measured from center to center of bearings 151). These are the same dimensions as mentioned in a previous exemplary embodiment; thus, the behavior of the present embodiment is essentially the same as described for the earlier case.

Lower (not shown in FIG. 11) and upper bumpers 180 are attached to ground link 160. The purpose of lower and upper bumpers 180 is to restrict the range of motion with which lower pivot link 130 and upper pivot link 140 may move. The purpose of providing this restriction is to prevent test head 110 from rotating more than approximately plus or minus five degrees from its nominal horizontal position. Thus, test head 110 is prevented from rotating so far as to cause the direction of the residual torque to become such that it tends to drive the test head away from the nominal horizontal position as previously described.

Figure 12:
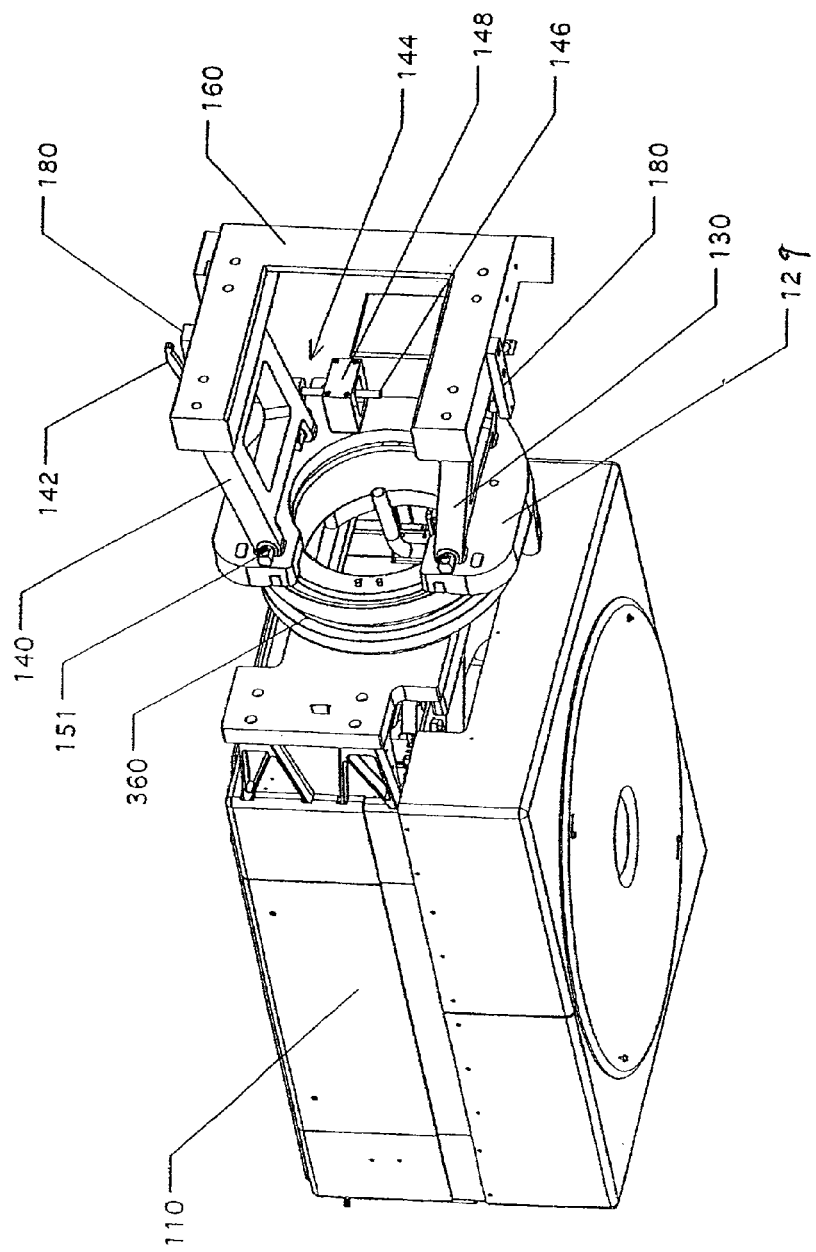
FIG. 12 is a further perspective view of the test head and positioner system shown in FIG. 11.

FIG. 12 is a back perspective view of the further exemplary embodiment shown in FIG. 11. As can be seen from FIG. 12, lower bumper 180 is included. Ground link 160 and load-carrying link 129 are both C-shaped and open on the same side. As mentioned before cable pivot assembly 360 may be of the split ring type. Then if test head 110 is of the type that has its cable extending from its rear mounting surface, it is possible to attach the test head to the positioner system without disconnecting the cable from either the test head or the cabinet. This is an important consideration because disconnecting and reconnecting the cable could void a test head manufacturer's warranty. It also save considerable labor during field installations. It is contemplated that the c-shaped members can be used with the embodiment of FIG. 1A as well.

Also in FIG. 12 it is seen that holding block 148 is attached to the rear of load carrying link 129. Shaft (screw) 146 extends through holding block 148. Screw 146 also extends through leveler mechanism 144. Referring again to FIG. 11, leveler mechanism 144 protrudes through adjuster bracket 170 so that screw 146 terminates at handle 142. Adjuster bracket 170 is rigidly attached to ground link 160.

Figure 13:
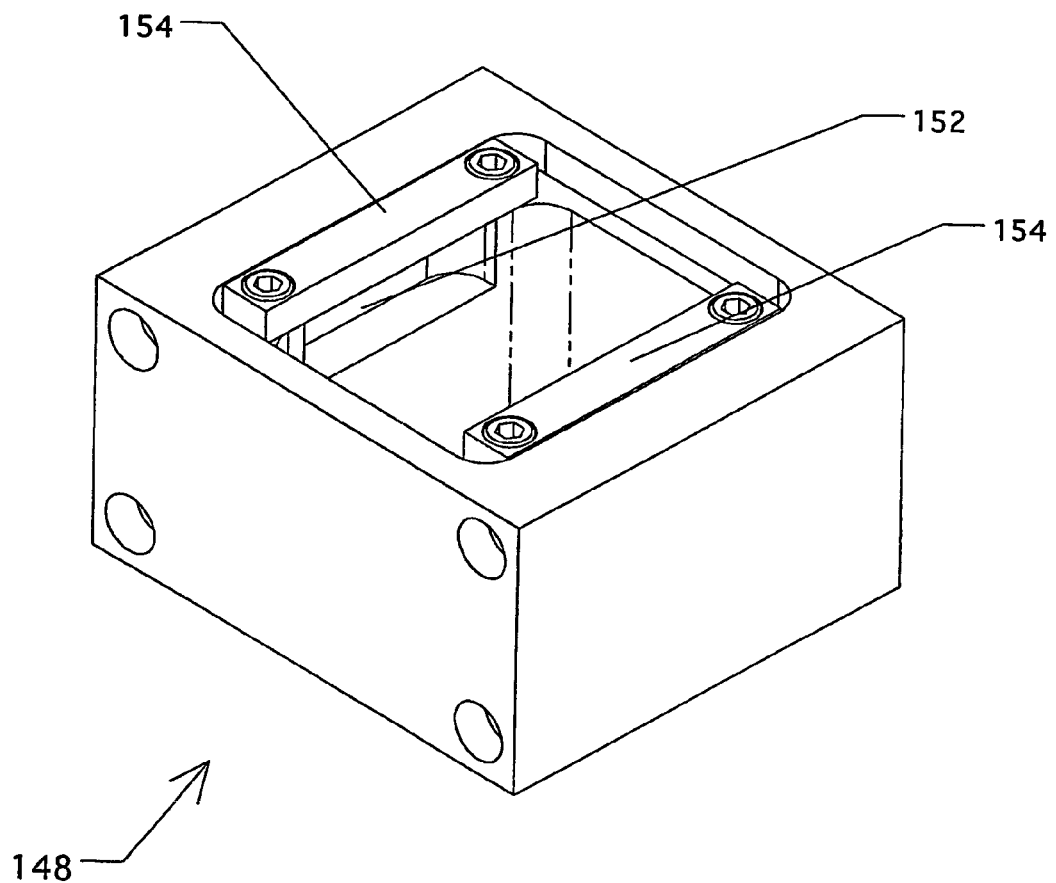
FIG. 13 is a perspective view of a holding block used with the exemplary embodiment shown in FIGS. 11 and 12.

Holding block 148 is more clearly shown in the perspective view of FIG. 13. It's purpose is to hold adjustment nut assembly 162 (described below). Holding block 148 includes channels 152 which are closed by adjustment nut caps 154.

Figure 14:
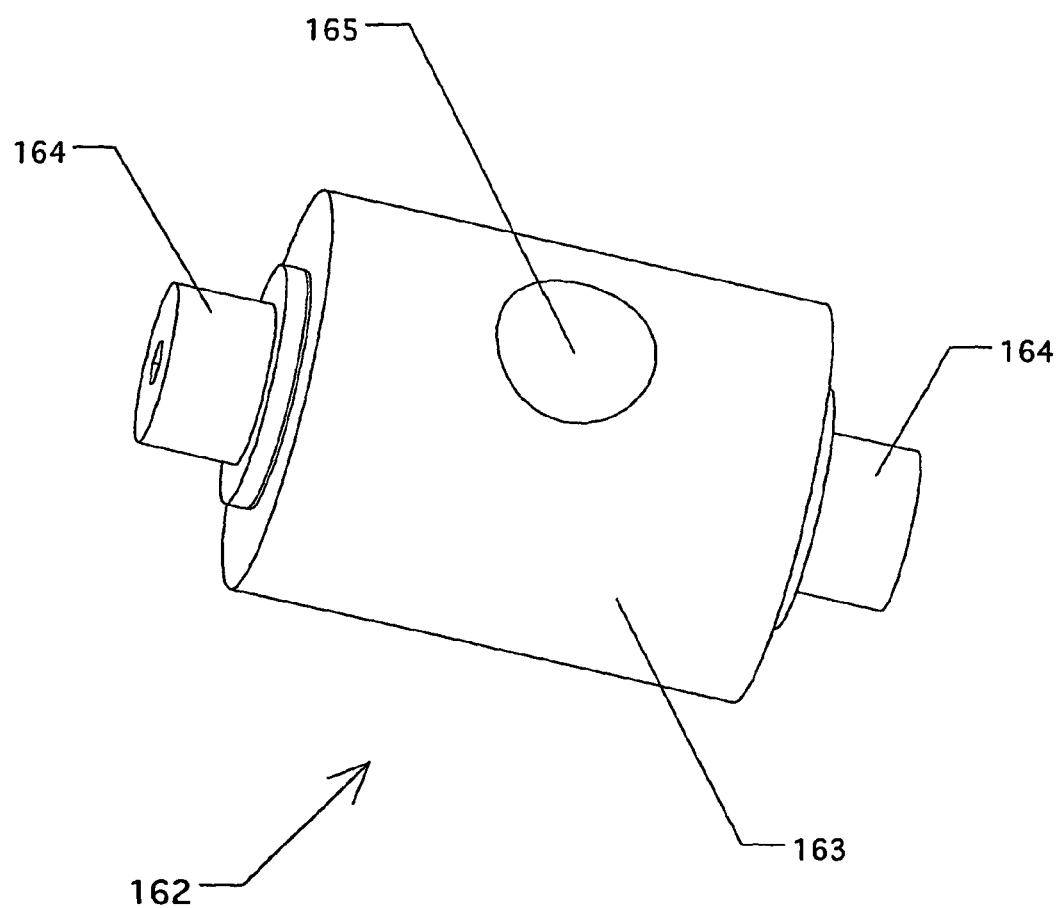
FIG. 14 is a perspective view of an adjustment nut assembly used with the exemplary embodiment shown in FIGS. 11 and 12.

FIG. 14 is a perspective view of adjustment nut assembly 162. Adjustment nut assembly 162 resides within holding block 148. Adjustment nut assembly 162 is comprised of nut 163 with cam followers 164 extending from opposite ends thereof. Cam followers 164 are situated within respective channels 152. Thus, adjustment nut assembly 162 is able to move back and forth within the holding block 148 by virtue of cam followers 164 moving back and forth within channels 152.

Figure 15:
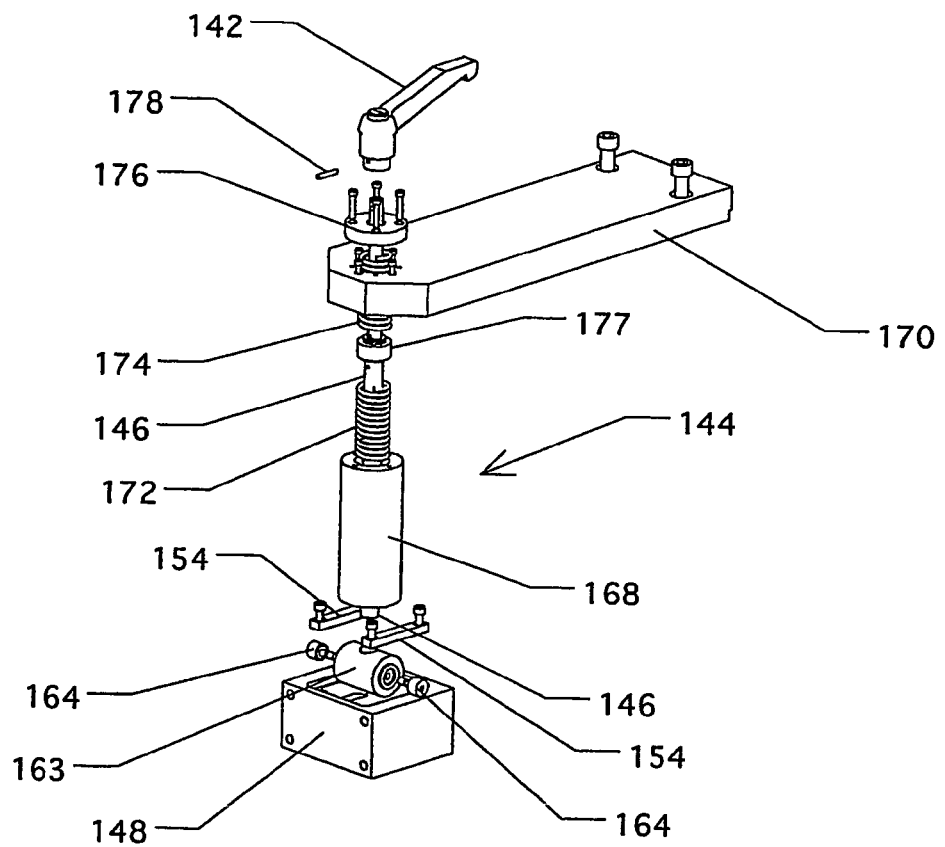
FIG. 15 is an exploded view of a leveler mechanism used in accordance with the exemplary embodiment shown in FIGS. 11 and 12.

An exploded view of leveler mechanism 144 is shown in FIG. 15. A cross section of the assembly is provided in FIGS. 16A-16C. Starting from the bottom of the FIG. 15, holding block 148 is included. Nut 163 resides within holding block 148. Cam followers 164 extend from opposite ends of 163. Nut 163 is able to move back and forth within holding block 148 as cam followers 164 move back and forth within the channels 152. Channels 152 are covered by adjustment nut caps 154. Screw 146 has a stepped diameter. The lower portion of screw 146 is threaded and has a relatively large diameter. The upper portion of screw 146 is not threaded and is a smaller diameter. Bearing 177 is fitted onto screw 146 at the step from one diameter to the other. Screw 146 is attached to nut 163 by having its lower, threaded end being inserted into threaded hole 165. Housing 168 is situated about screw 146. Compression springs 172 and 174 are fitted about screw 146 and are separated by bearing 177. Cylindrical housing 168 has a cylindrical bore into which the subassembly comprising screw 146, springs 172, 174, and bearing 177 is fitted. Bearing 177 slidingly fits within the cylindrical bore, enabling screw 146 to be rotated smoothly. Springs 172, 174 are held within cylindrical housing 168 while screw 146 extends through both ends. The upper, non-threaded end of screw 146 extends through an opening in adjuster bracket 170. Shaft 146 further extends through an opening in spring retaining plate 176 which is attached to the surface of adjuster bracket 170. Finally, handle 142 is attached to the top end of shaft member 146 with roll pin 178. Spring 172 is thus compressed between bearing 177 and the lower end of housing 168. Spring 174 is compressed between bearing 177 and spring retaining plate 176.

The operation of leveler mechanism 144 may now be described; it provides three functions. First it provides for adjustment of the position of the load in a similar manner as the position adjustment mechanism illustrated in the system of FIG. 4. Second, by means of the springs, it provides a force to generate a moment about the load's center of gravity to cancel a residual torque arising from reaction forces from the pivot links that do not act exactly through the center of gravity. Third, it provides compliance for docking. In operation handle 142 may be rotated, which rotates screw 146, which in turn causes nut 163 to move upwards or downwards along the threaded portion of screw 146. Because nut 163 is held within holding block 148, which is attached to load carrying link 120, and housing 168 is fixed to ground link 160, the load is caused to rotate. As the load is rotated by means of turning screw 146, the lengths of springs 172, 174 adapt so that in any stable position achieved, they generate a moment sufficient to offset the residual torque at that position. Accordingly an operator may rotate handle 142 as necessary to achieve a desired nominal position, which is balanced, within the range of motion provided. An external force applied to it may further rotate the load compliantly. When an external force is applied, springs 172, 174 change length in response, allowing the load to rotate. Because the operation causes the springs to move in a direction so as to oppose the applied force, and because of the residual torque developed by rotating the load, an overall torque is developed which will tend to return the load to its nominal position when the external force is removed.

Figure 16A:
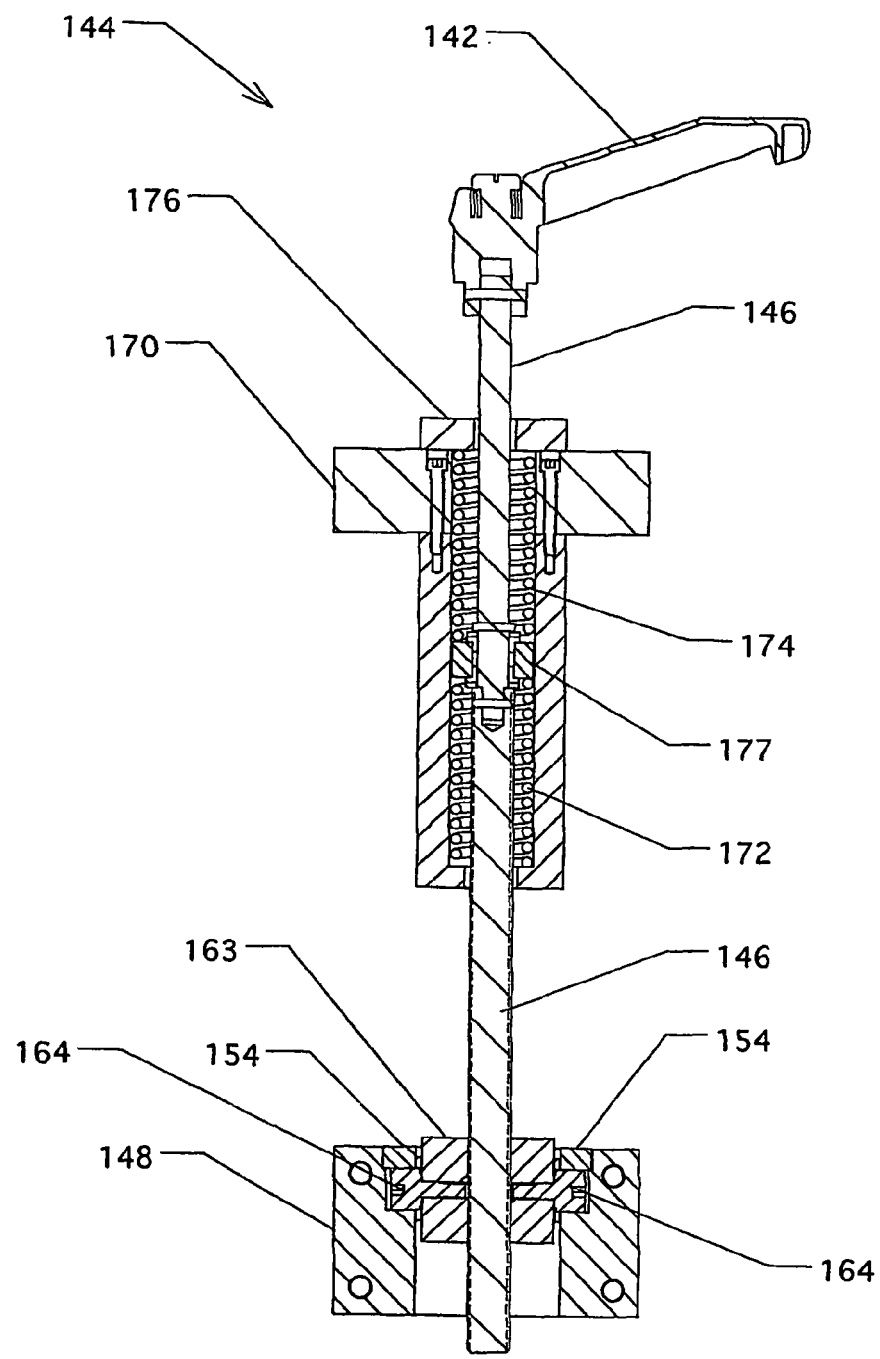
FIGS. 16A-16C illustrate the leveler mechanism of FIG. 15 in various orientations.
Figure 16B:
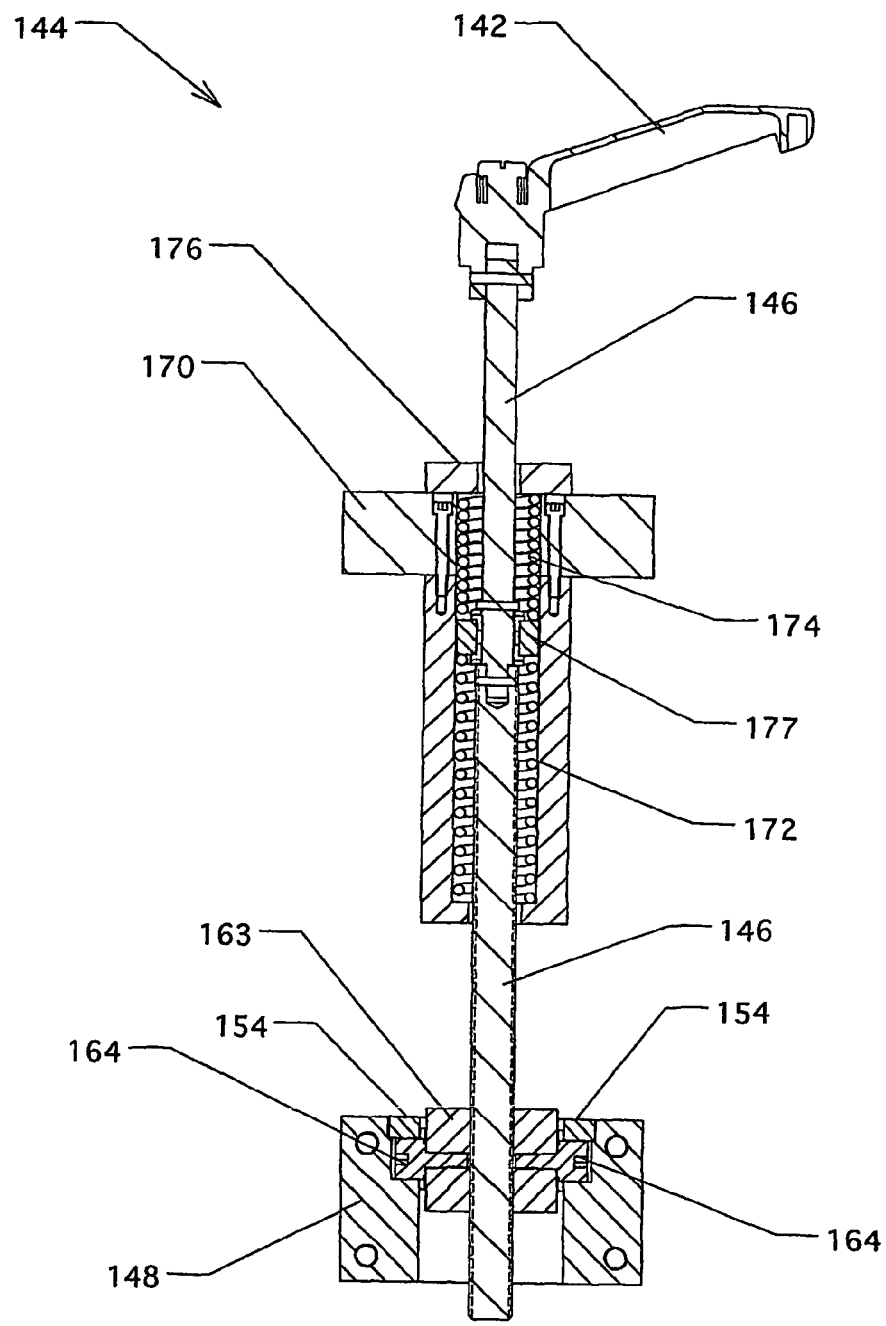
Figure 16C:
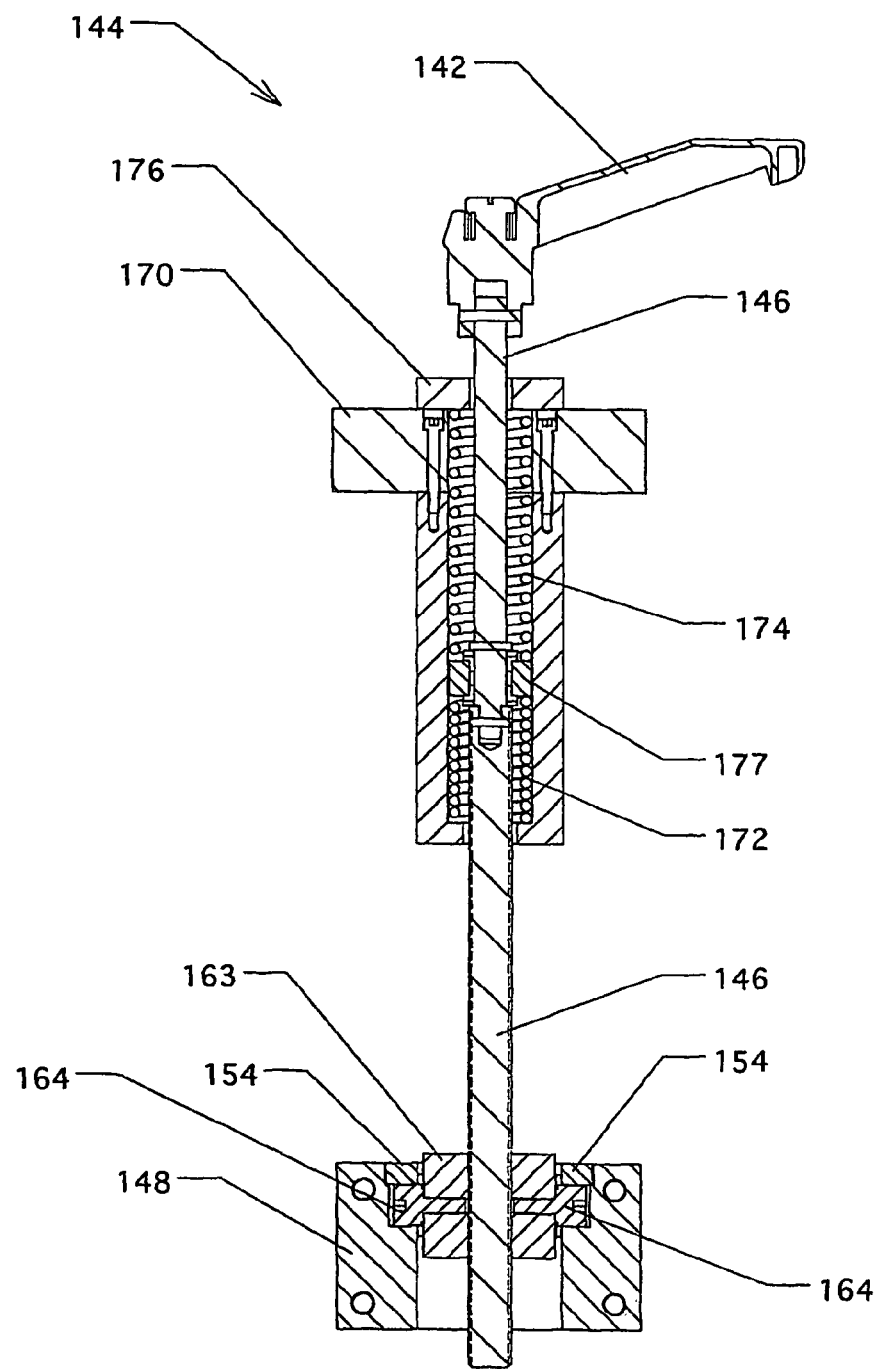

FIGS. 16A-16C show cross sections of leveler 144 in three positions of the load with screw 146 at a constant insertion within nut 163. That is to say that screw 146 has not been rotated from one cross section to the next. FIG. 16A depicts the situation with the load in a nominal position. Bearing 177 is generally centrally located along the length of housing 168. In FIG. 16B the load has been rotated so that load-carrying link 120 and holding block 148 have been raised. Spring 174 has compressed; spring 172 has lengthened; bearing 177 has moved upwards within housing 168; and handle 142 is raised with respect to bracket 170. Similarly, in FIG. 16C the load has been rotated so that load-carrying link 120 and holding block 148 have been lowered. Spring 174 has lengthened; spring 172 has compressed; bearing 177 has moved downwards within housing 168; and handle 142 is lowered with respect to bracket 170.

It is noted that leveler mechanism 144 provides limits to the rotative motion of test head 110. However, mechanism 144 is a relatively fragile mechanism with respect to large unexpected forces that might be accidentally imposed on test head 110 in an industrial setting. Thus, the much more rugged bumpers 180 are provided; these may be adjusted so that they stop motion a short distance before the limit of motion provided by leveler mechanism 144 is reached.

Side views, showing five different configurations of the presently discussed embodiment, are provided in FIGS. 17A-17E.

Figure 17A:
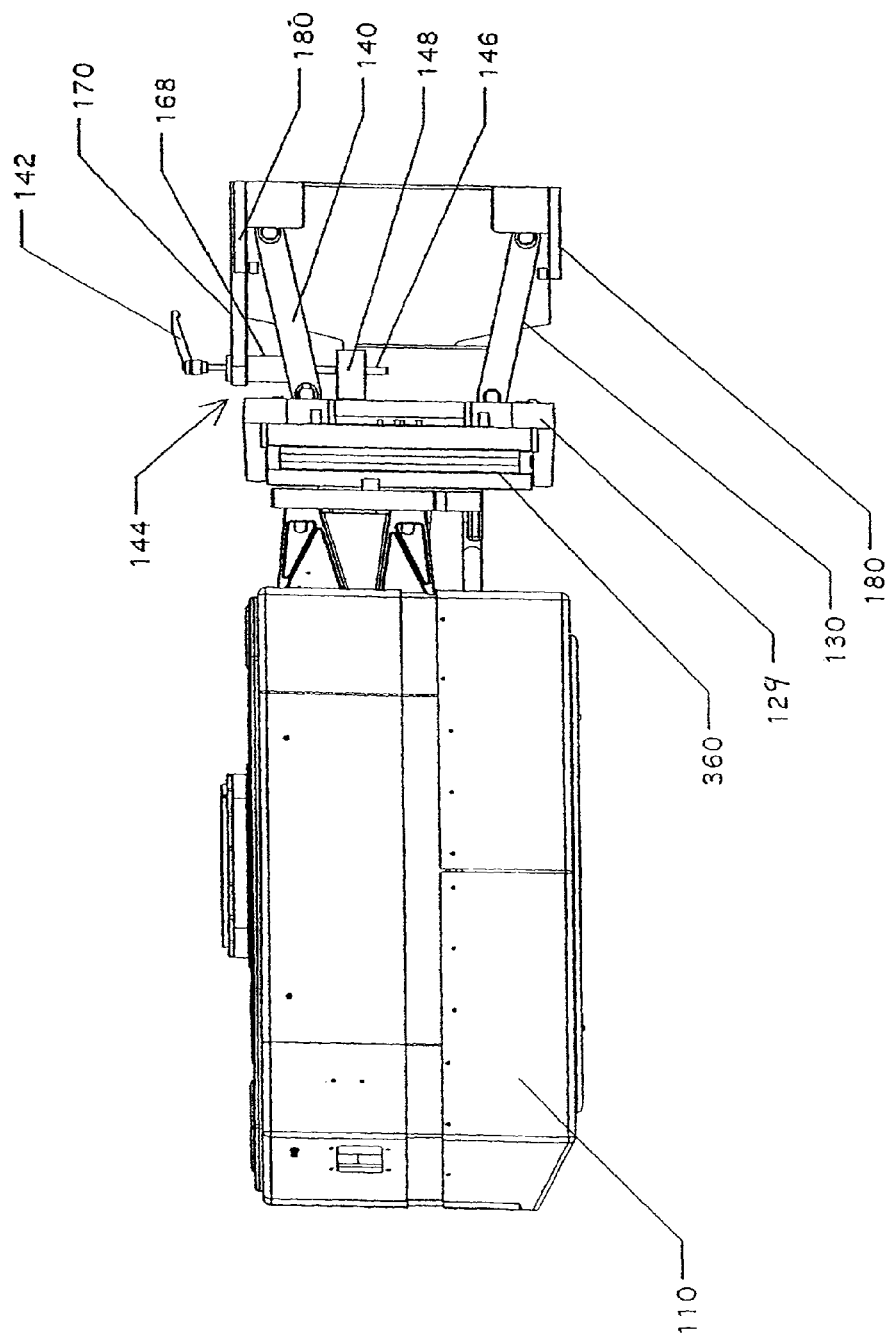
FIGS. 17A-17E are side views of the test head and positioner system shown in FIGS. 11 and 12 with the test head and joint in respectively different configurations.

The side view of FIG. 17A shows the test head 110 adjusted to a nominal level position. This corresponds to the view of leveler mechanism 144 shown in FIG. 16A.

Figure 17B:
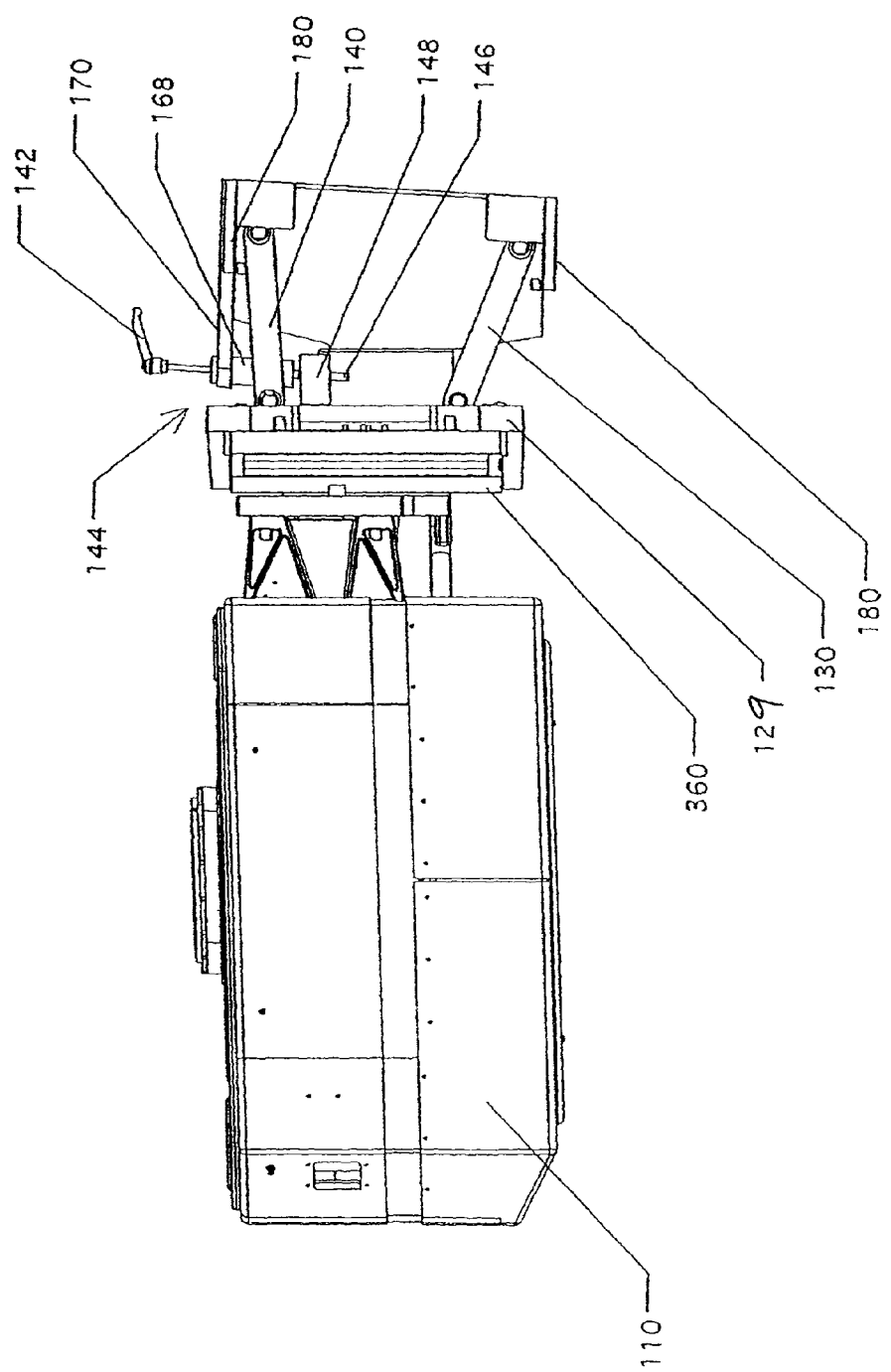

In FIG. 17B an externally applied force (not shown) has rotated test head 110 a few degrees counterclockwise. The configuration of leveler mechanism 144 shown in FIG. 16B corresponds to the side view of test head 110 shown in FIG. 17B. That is, the lengths of springs 172, 174 (shown in FIG. 16B) have changed and screw 146 has moved upwards relative to housing 168 to provide the compliance necessary for test head 110 to move in response to the external force.

Figure 17C:
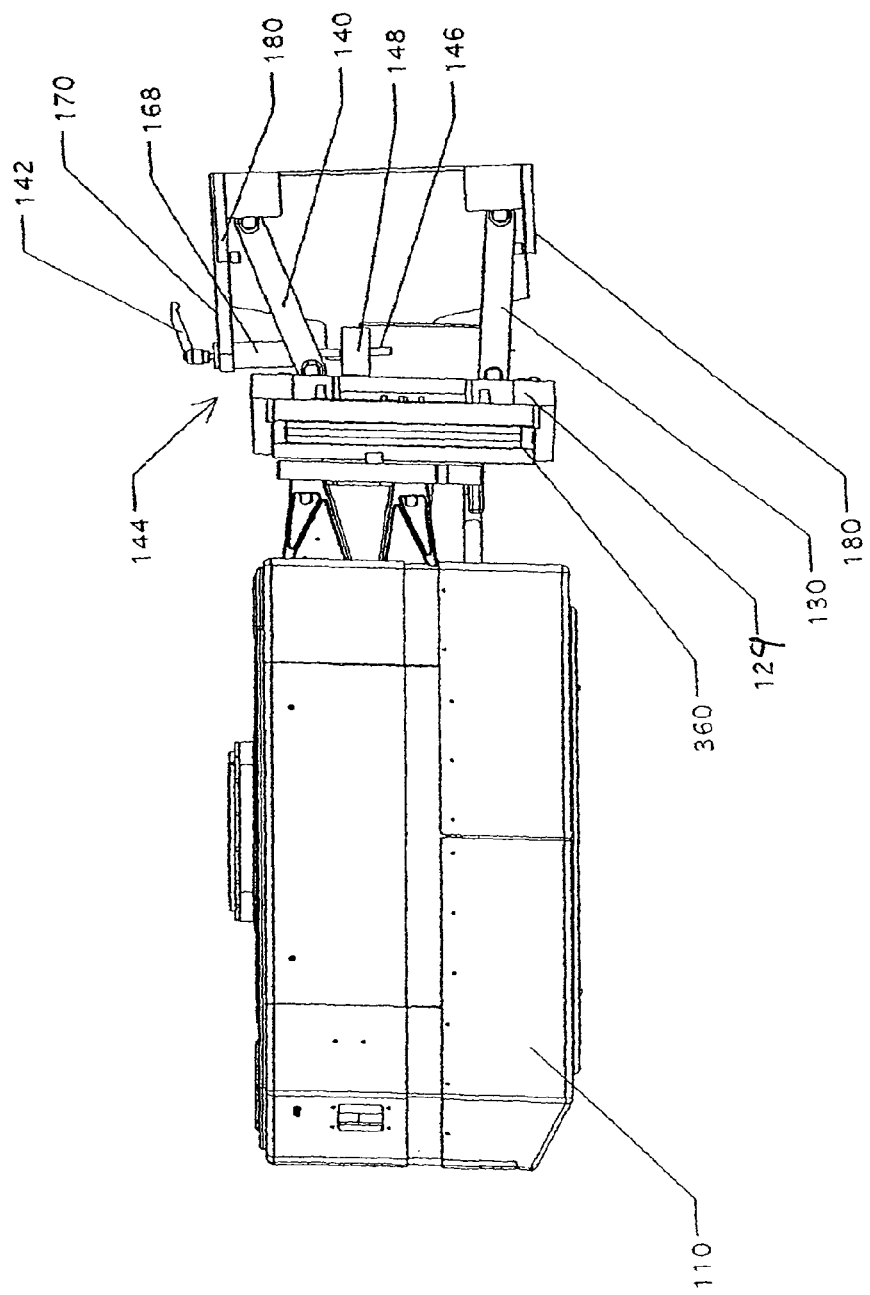

Similarly, in FIG. 17C an externally applied force (not shown) has rotated test head 110 a few degrees clockwise. The configuration of leveler mechanism 144 shown in FIG. 16C corresponds to the side view of test head 110 shown in FIG. 17C. That is, similar to the previous configuration, the lengths of springs 172, 174 (shown in FIG. 16C) have changed and screw 146 has moved downwards relative to housing 168 to provide the compliance necessary for test head 110 to move in response to the external force.

Figure 17D:
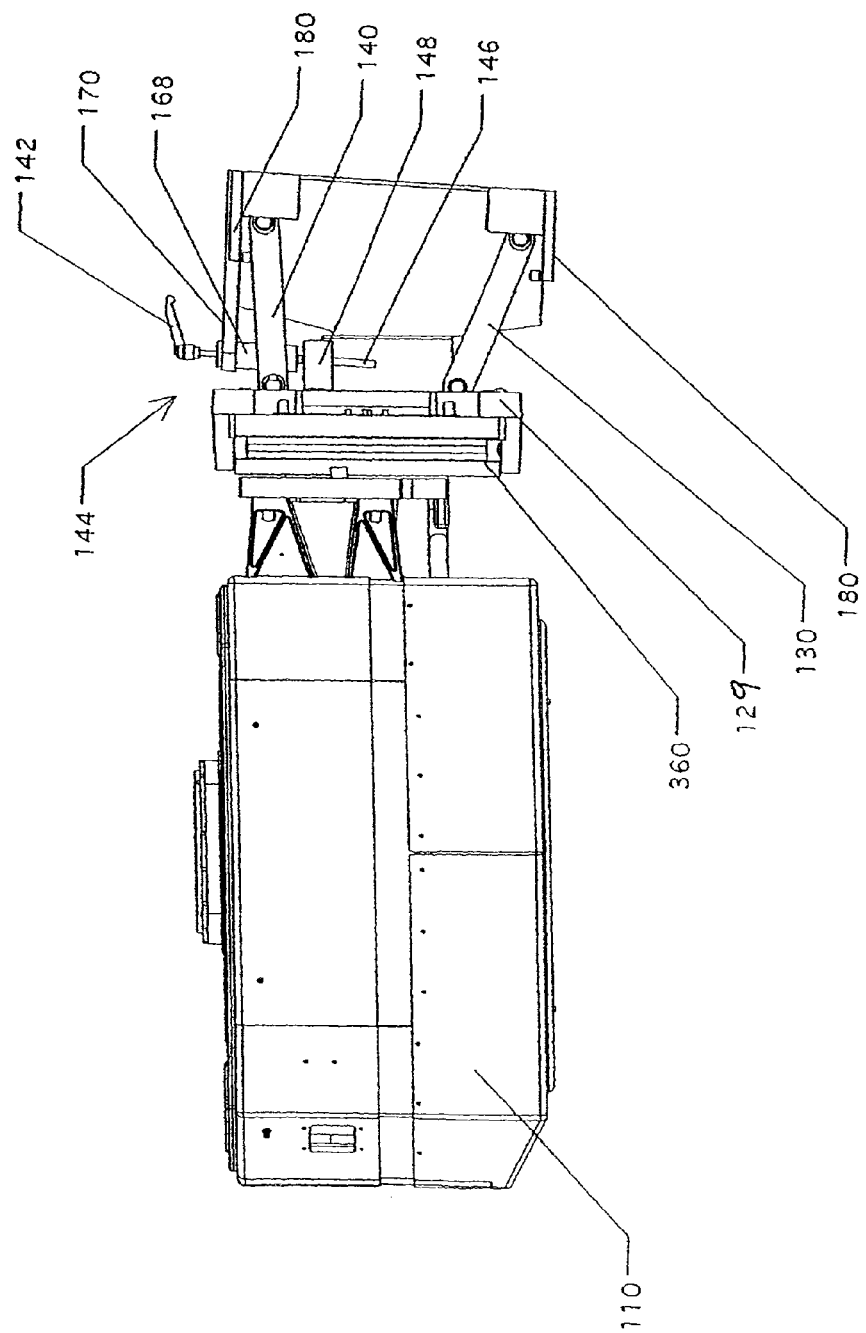
Figure 17E:
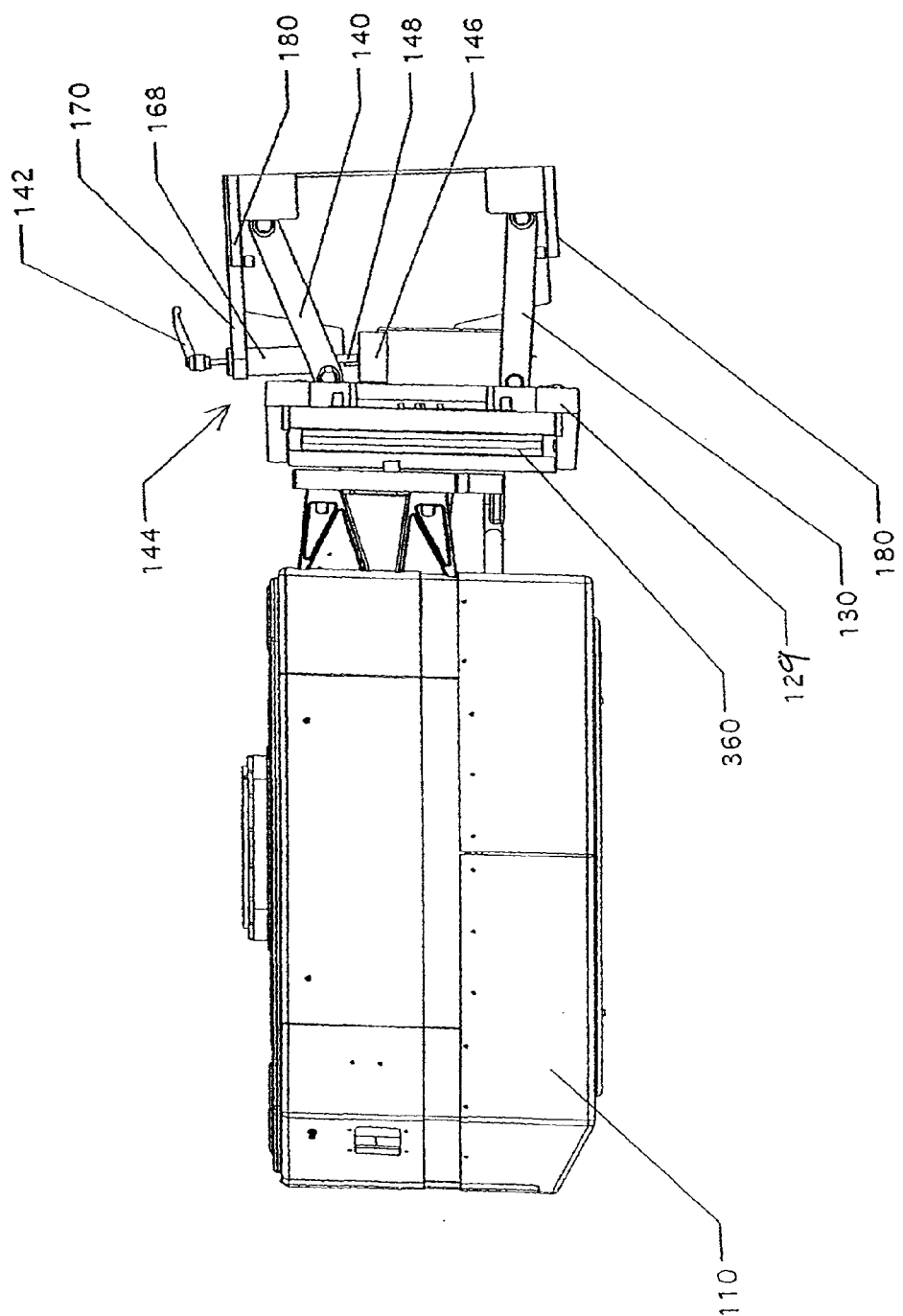

In FIG. 17D test head 110 has been rotated a few degrees counter clockwise from its level position of FIG. 17A by operating handle 142. That is, handle 142 (and thus screw 146) has been rotated in a direction to cause holding block 148 to move upwards relative to its position shown in FIG. 17A. As holding block 148 has moved upwards, load carrying link 120 has moved upwards with it. Furthermore, as load carrying link 120 has moved upwards, lower pivot link 130 and upper pivot link 140 have rotated to a clockwise position compared to FIG. 17A. Thus, as shown in FIG. 17D, test head 110 rotates counterclockwise relative to the position shown in FIG. 17A.

In FIG. 17C test head 110 has been rotated a few degrees clockwise from its level position of FIG. 17A by operating handle 142. That is, handle 142 (and thus screw 146) has been rotated in a direction so that holding block 148 has moved downwards relative to the position of holding block 148 shown in FIG. 17A. As holding block 148 has moved downwards relative to screw 146, lower pivot link 130 and upper pivot link 140 have rotated counterclockwise relative to the positions shown in FIG. 17A. Also as shown, this results in test head 110 moving in a clockwise orientation relative to the orientation of test head 110 shown in FIG. 17A.

As can also be shown in FIGS. 17B and 17D, as holding block 148 has moved upwards, screw 146 has also moved to the right relative to its position within holding block 148 shown in FIG. 17A. Similarly, as can also be shown in FIGS. 17C and 17E, as holding block 148 has moved downwards, screw 146 has also moved to the left relative to its position within holding block 148 shown in FIG. 17A. This is why it is necessary for nut 163 to be able to move within holding block 148 (i.e. this is why cam followers 164 are free to move within channels 152).

Figure 19:
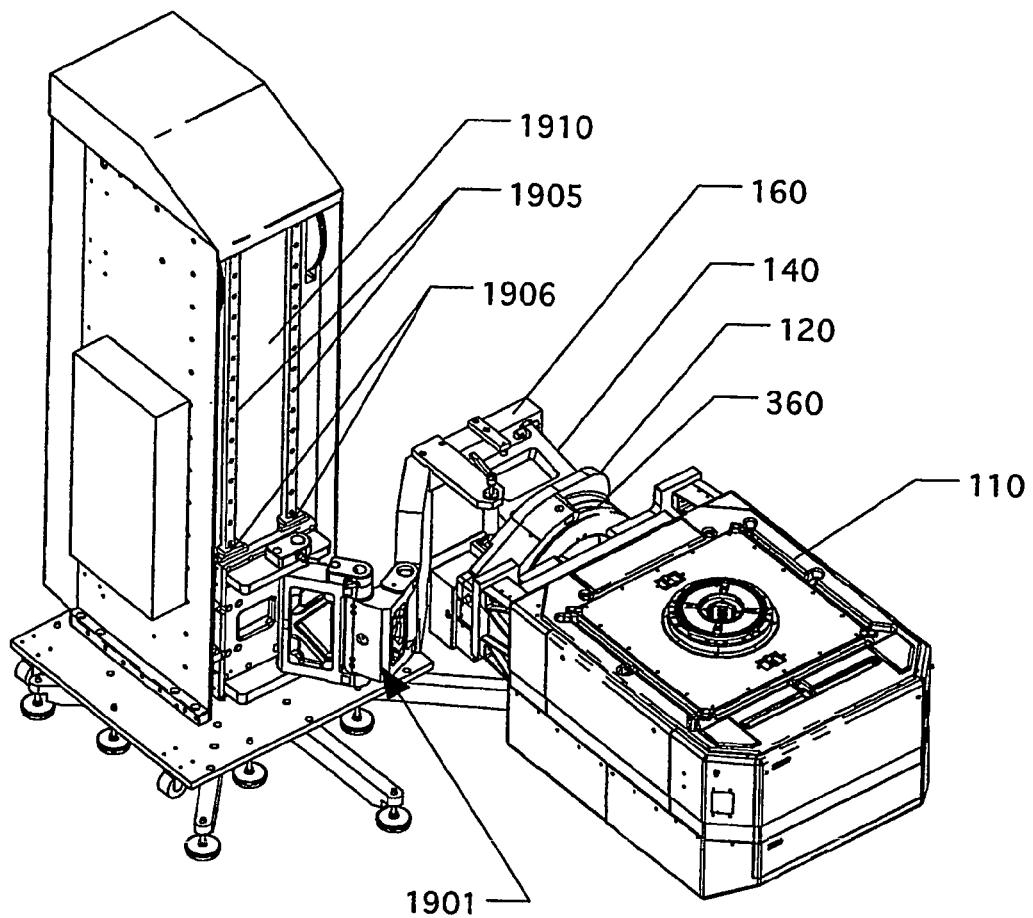
FIG. 19 is a perspective view which illustrates the further exemplary embodiment of FIGS. 10A-10D, 11-16, and 17A-17E, and further shows how the structures illustrated in the aforementioned figures may be used in conjunction with a positioner system.
Figure 23:
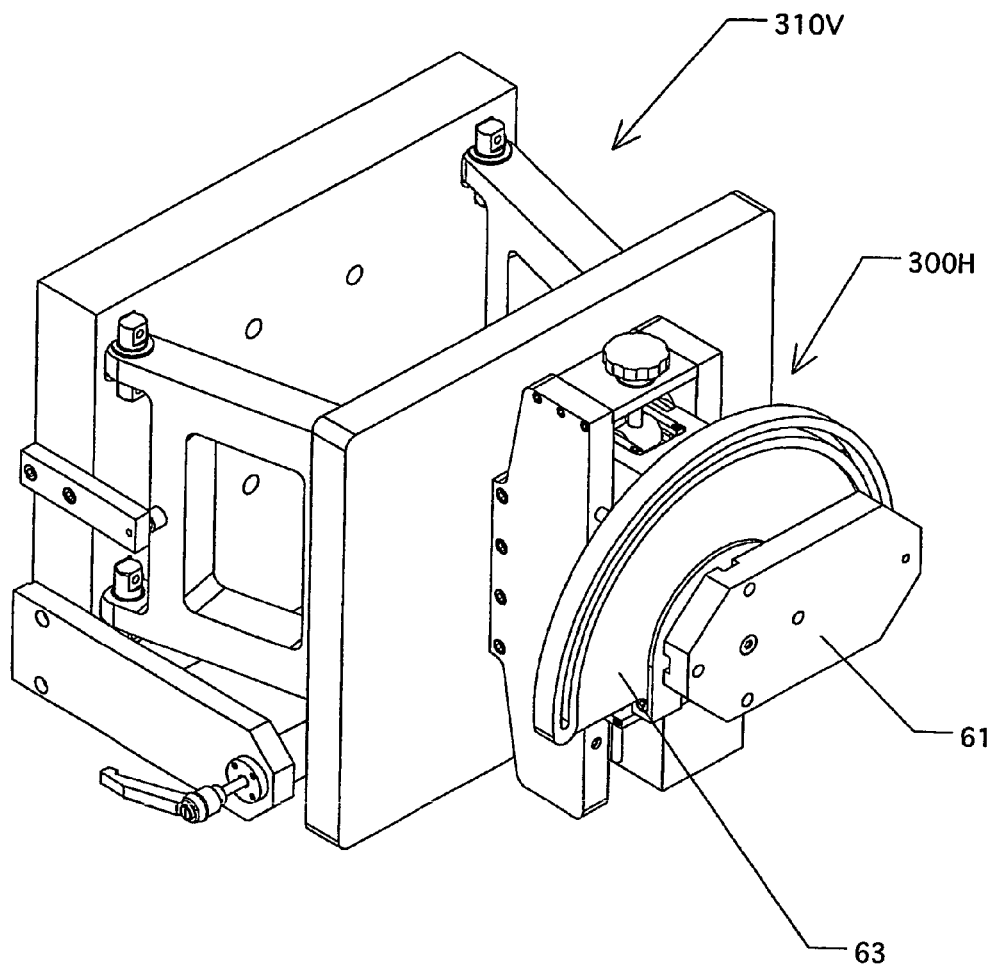
Figure 24A:
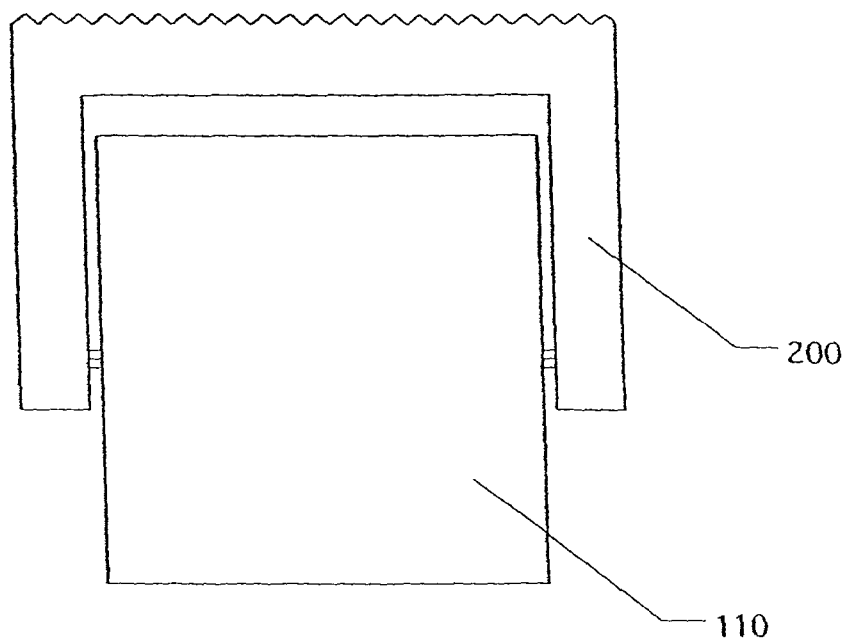

FIG. 19 is a perspective drawing of a test head positioning system incorporating the exemplary embodiment of the invention described in conjunction with FIGS. 11 though 17E. As has been described herein, test head 110 is attached to load carrying link 120. In this case, load-carrying link 120 is coupled to a cable pivot assembly 360, which is more clearly described in aforementioned U.S. Patents. Cable pivot assembly 360 (comprising a hollow ring) supports test head 110. Behind load carrying link 120 is lower pivot link 130 (not visible) and upper pivot link 140. Lower pivot link 130 and upper pivot link 140 are coupled to link 160. The four links 120, 130, 140, 160 provide a remote axis pivot joint that allows test head 110 to rotate or tumble about a horizontal axis ("tumble axis"). Cable pivot assembly 360 provides test head rotation about an axis orthogonal to the tumble axis and which passes through the center of the cable pivot mechanism. A portion of cable pivot assembly 360 may be removed, so that test head 110 is mounted without the need to disconnect and reconnect it's cable. Thus, the cable runs through the hollow middle of cable pivot assembly 360. It is contemplated that this configuration can be used with the embodiment of FIG. 1A as well. Link 160, in turn, is coupled to the remaining apparatus of the positioner system, which must provide an additional four degrees of motion freedom. In the system of FIG. 23, a mechanism 1901, as described in U.S. Pat. No. 4,588,346 having three vertical rotation axes provides two linear motion degrees of freedom (in-out and side-to-side) in a horizontal plane plus a third rotational degree of freedom about a vertical axes. Linear vertical motion is the sixth degree of freedom which is provided by linear rails 1905 attached to vertical column 1910 combined with appropriate linear bearings 1906. Thus, movement of the test head with 6 degrees of motion is possible.

Thus, two practical embodiments of remote axis pivot joint (or wrist joint) have been described. The first being of the type shown in the exploded view of FIG. 4, and the second being of the type illustrated in FIGS. 11 and 12. For convenience those of the first type will be referred to as "glide" types, and those of the second type will be referred to as "link" types. Both types operate on the same general principle to provide balanced rotation of a load about a horizontal axis. In particular the load is supported by a movable structure in such a way that at least at a nominal position, the sum of the moments about the center of gravity of the load is zero. The movable structure comprises parts that are relatively fixed in space and support parts that may move with respect to the fixed parts. The contact areas between the movable parts and the fixed parts all lie to one side of a vertical plane that includes the horizontal axis of rotation. Thus, both glide and link styles of embodiments of the invention may be referred to as balanced remote axis pivot joints.

The system in FIG. 19 employs one balanced remote axis pivot joint. As was described earlier, a separate mechanism provides rotation of the load about a vertical axis that is remotely located from the mechanism. However, this mechanism simultaneously provides and allows two degrees of motion freedom in the horizontal plane. In certain applications it is desirable in a positioning system to have separate mechanisms for each motion axis so that each motion can be operated independently while all of the others remain fixed.

A remote axis pivot joint may alternatively be used to provide rotation about a vertical axis. Although this does not make use of the join's ability to support a load about a horizontal axis, it does provide the advantage of allowing the load to be rotated about a vertical axis that is remote from the joint. Further, two remote axis pivot joints may be advantageously combined in one system to provide rotations of a load about two axes. Four possible combinations are illustrated in FIGS. 20 through 23, which are described below.

Figure 20:
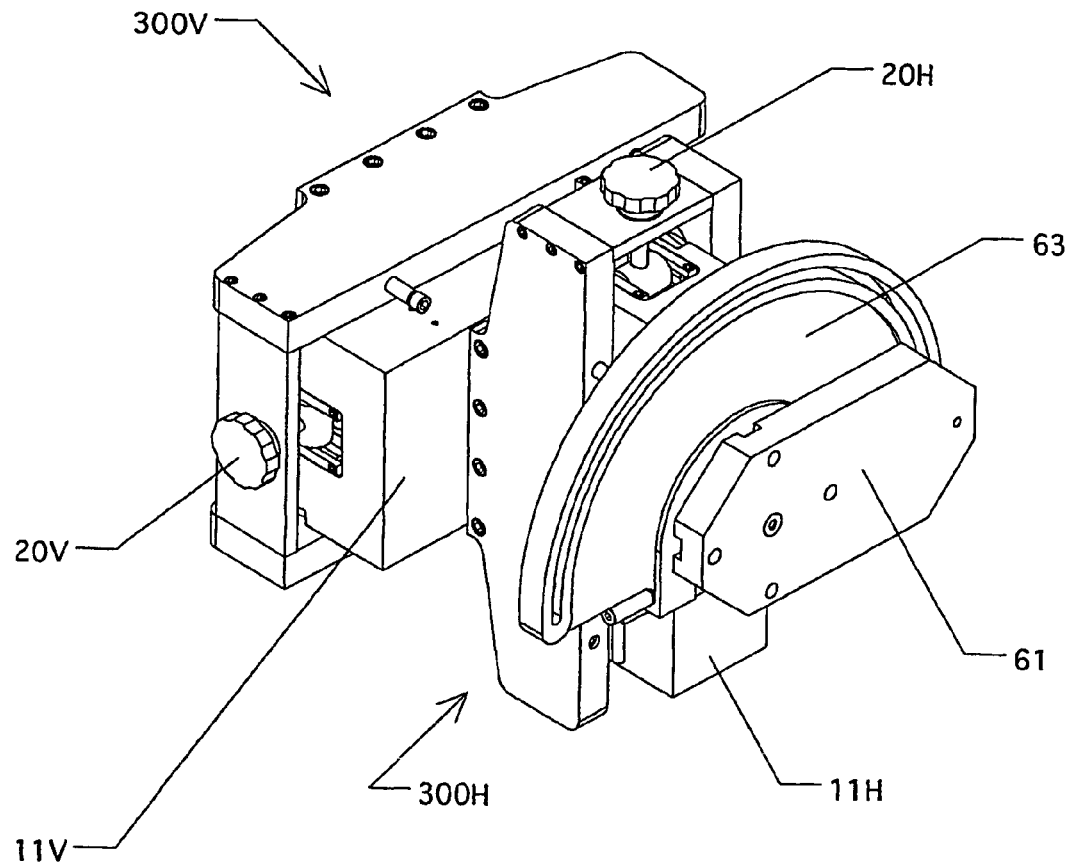
FIGS. 20, 21, 22, and 23 are perspective views of four configurations that incorporate two remote axis pivot joints to provide two axes of rotation.

In FIG. 20, two glide type remote axis pivot joints 300H and 300V have been adapted to provide remote axis horizontal and vertical rotations. (Note that the characters H and V are appended to reference numbers to distinguish between similar components on the two units.) Pivot joint 300H is the same as the one in FIG. 4 except that cylinder 7a has been removed. As previously described, joint 300H provides balanced support and rotation of the load about a horizontal axis (the pitch axis). The load (not shown) may be attached as before to mounting plate 61, and rotation about a second axis (the roll axis) is thereby provided. Note that the roll axis tilts with respect to the horizontal as rotation about the pitch axis occurs. Remote axis pivot joint 300V is oriented orthogonally to joint 300H. It provides rotation about a vertical axis (the yaw axis). Mounting plate 7bH (not visible) of joint 300H is rigidly attached to wrist housing 11V of joint 300V; this maintains the angle between the respective rotation axes of the two joints constant. In this case, of course, the axes are orthogonal, one vertical and one horizontal. Mounting plate 7bV (not visible) of joint 300V may be attached to a base or the remainder of a positioner in any convenient manner. Rotating knob 20V provides manual adjustment of the load about a vertical yaw axis, and rotating knob 20H provides manual adjustment about a horizontal pitch axis. Thus the mechanism of FIG. 20 provides three degrees of rotational freedom. Each axis may be rotated independently while the other two remain fixed. All three axes may each be operated independently of any other degrees of motion freedom that may be incorporated in the overall positioner system.

Figure 21:
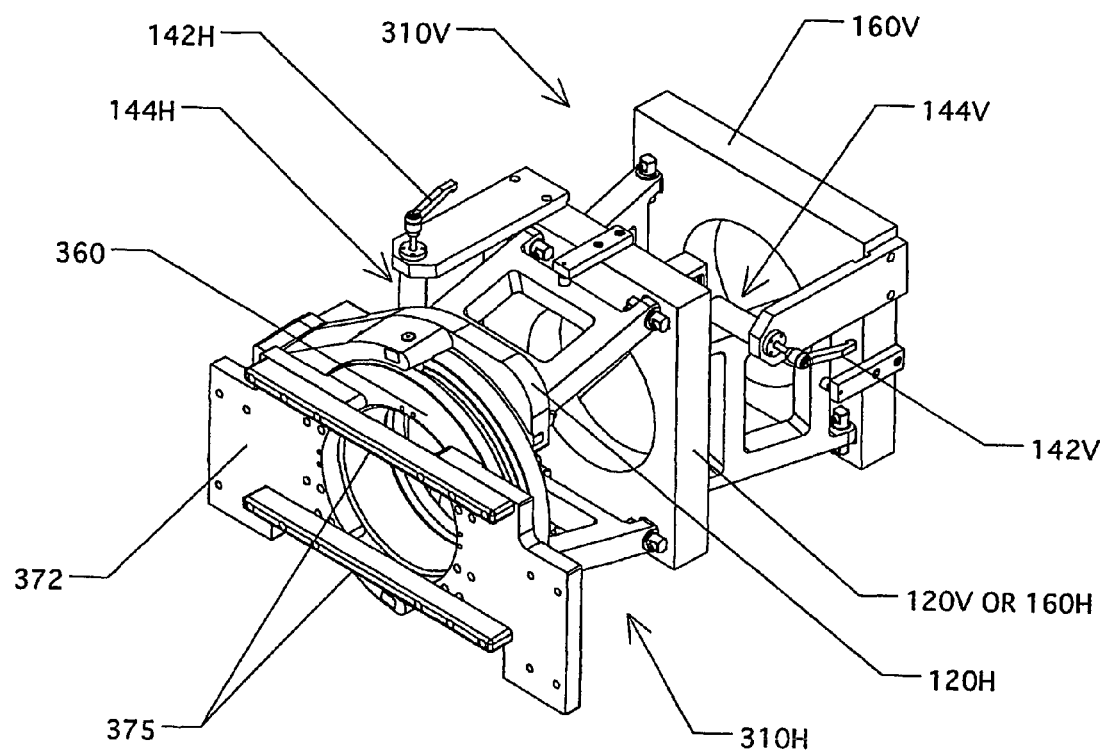

FIG. 21 illustrates the utilization of two links type remote axis pivot joints 310H and 310V to provide remote and independent pitch axis and yaw axis rotation respectively. The concept is similar to that of FIG. 20 except that links type joints have been substituted for glide type joints. In FIG. 21, load-carrying link 120V of yaw axis joint 310V is simultaneously used as ground link 160H of pitch axis joint 310H. Also in this case, the load (not shown) may be attached to load-carrying link 120H of joint 310H by means of cable pivot assembly 360 as was previously discussed in regards to FIGS. 11 through 19. Load plate 372 is attached to the rotating member of cable pivot 360. The ultimate load (not shown) may be attached to mounting bars 375, which are secured to load plate 372. Thus, as in FIG. 20, the overall mechanism provides three degrees of rotational freedom for the load, where each rotational movement may be accomplished independently of any other degrees of motion freedom in the overall positioner system. Adjustment mechanism 144H and 144V may be similar to the one described with respect to FIG. 15. Mechanism 144H provides by means of turning handle 142H manual adjustment of rotation about the horizontal axis and includes springs as previously described to provide balance and compliance. Mechanism 144V provides by means of turning handle 142V manual adjustment of rotation about the vertical axis and includes springs as previously described to provide compliance. In the configuration of FIG. 21 a cable extending from the load to another piece of apparatus may be routed through the cable pivot assembly and the openings in links 120H, 160H/120V, and 160V.

Figure 22:
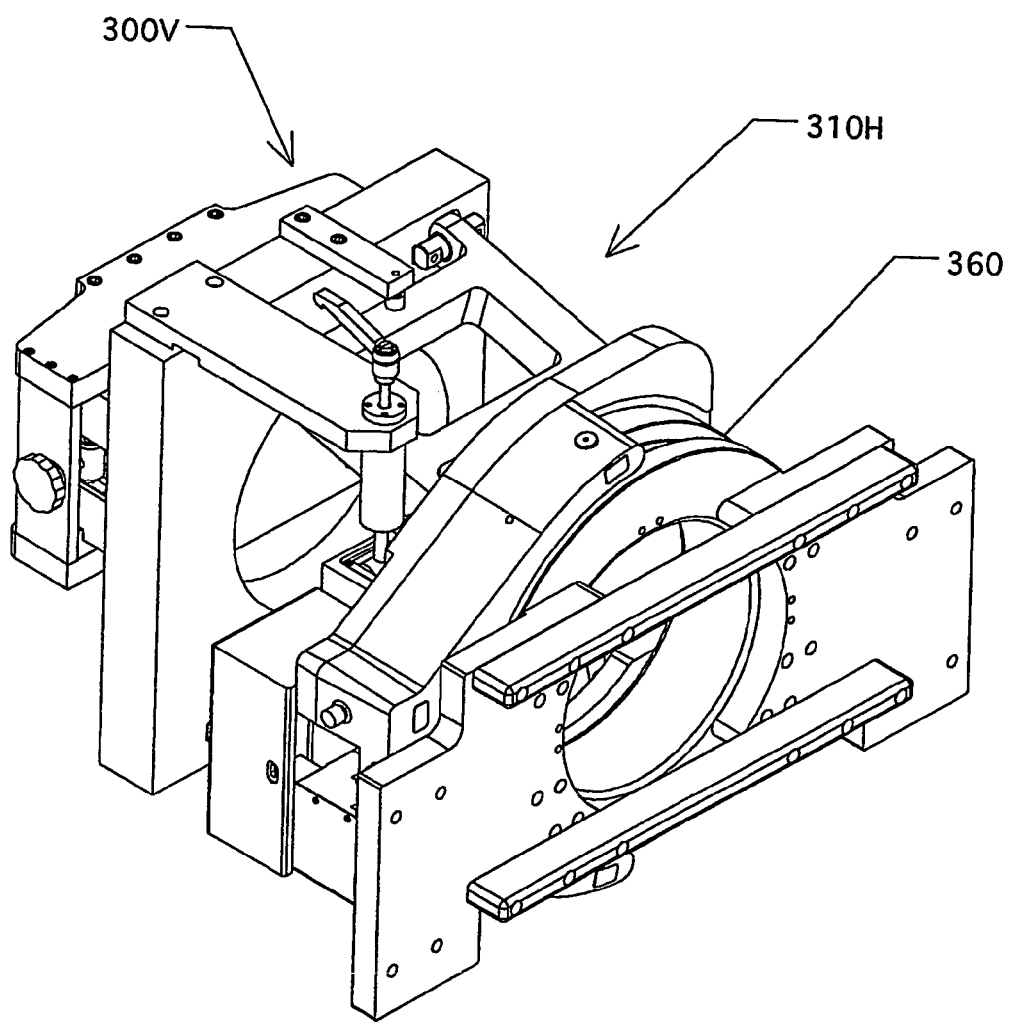

Of course it is possible to achieve similar results by combining a single glide joint with a single links joint. FIGS. 22 and 23 illustrate two ways in which this may be accomplished. In FIG. 22 a wrist joint 300V providing rotation about a vertical yaw axis may be coupled to the base or positioner system. Rigidly attached to wrist housing 11V (not visible) of glide joint 300V is links joint 310H. Links joint 310 H provides rotation about a horizontal pitch axis. Links joint 310H supports cable pivot assembly 360, which in turn is coupled to the load by means of plate 372 and mounting bars 375. FIG. 23 is similar in concept to FIG. 22 except that the positions of the glide joint and link joint are reversed. Thus, link joint 310V is attached to the base and provides rotation about a vertical yaw axis. Glide joint 300H is supported by links joint 310V and provides rotation about a horizontal pitch axis. Roll plate 63 and mounting plate 61 permit the load (not shown) to be attached and rotatable about a third roll axis, as previously described.

The mechanisms in FIGS. 20 through 23 all have a remote axis pivot joint that is oriented to provide vertical rotation attached to the positioner and supporting a second remote axis pivot joint that provides horizontal rotation. It may be seen that by this ordering of joints rotations about vertical and horizontal axes will always be performed independently of the states or positions of the individual joints. It is also feasible, essentially by rotating these assemblies by ninety degrees, to reverse this order and have the joint that provides horizontal rotation attached to the positioner and supporting the second joint. However, in this configuration, the second joint provides a rotation about an axis that variably tilts from the vertical as the state or position of the first joint changes. This may prove useful in certain applications.

While many positioners are designed to allow docking to all types of peripherals, others are designed to preferably allow docking with a particular type of peripheral. For example if a system is to be designed for docking with wafer probers, the test head will always be brought downwards for docking and it is important to provide compliant rotation about a vertical axis through the center of the device under test interface. In this case using a glide type pivot joint in a configuration such as FIG. 20 or 22 could be preferable, as it provides rotation about an axis fixed in space. However, in the case of docking with a vertical plane package handler, compliant rotation about a horizontal axis through the center of the dut interface is desirable. In this example a configuration where a glide type of jpoint oriented for rotation about a horizontal axis such as in FIG. 21 or 23 would be preferred.

Furthermore, the roll axis coupling has been shown as the final coupling to the load, and it has been noted that the roll axis tilts from the horizontal according to the state and position of other joints. In certain applications it may become desirable to change the order of couplings so that the roll axis unit is placed between two remote axis pivot joints, or so that the roll axis is directly coupled to the positioner and supports the remaining joints. In short the invention is not limited by the ordering of the joints.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. Apparatus for supporting a load, comprising:
   a pivot apparatus coupled to said load and movable with said load;
   a base stationary relative to said pivot apparatus;
   at least two areas of support between said pivot apparatus and said base, wherein respectively opposite force components generated by earth gravity pulling said load downward
   a) intersect at said load; and
   b) are at said two areas of support;
   one of said areas of support is vertically higher than another of said areas of support;
   said two areas of support move along at least one curved path between a vertically higher elevation and a vertically lower elevation to tilt said load;
   said two areas of support move in a direction between said vertically higher elevation and said vertically lower elevation causing said load to rotate about an axis which intersects said load;
   an adjuster bracket attached to said base,
   a holding block coupled to and movable with said pivot apparatus, and
   an actuator between said adjuster bracket and said holding block, wherein responsive to said actuator drawing said holding block towards or away from said adjuster bracket, said load rotates about said axis which intersects said load.

2. Apparatus for supporting a load according to claim 1, wherein said pivot apparatus includes circular members situated at said two areas of support, said circular members move along said curved path to tilt said load.

3. Apparatus for supporting a load according to claim 1, wherein said pivot apparatus includes at least one member at which said two areas of support are situated, said pivot apparatus moves along said curved path which is concave relative to said load.

4. Apparatus for supporting a load according to claim 1, wherein said curved path is oriented in a vertical plane, and said pivot apparatus situated so that upward movement of said pivot apparatus along said curved path results in a surface of said load opposite to a further surface of said load, facing said curved path, tilting downwards.

5. Apparatus for supporting a load according to claim 1, said pivot apparatus situated so that movement of said pivot apparatus along said curved path results in said load tilting about said axis which intersects said load wherein said axis substantially intersects a center of gravity of said load.

6. Apparatus for supporting a load according to claim 1, further comprising a roll lock plate for rotating said load about an axis orthogonal to a further axis about which said load tilts.

7. Apparatus for supporting a load according to claim 1, further comprising a link between said pivot apparatus and said base, said link having a first pivot point at said base and a second pivot point at said pivot apparatus, said link rotates either towards or away from said base as said load tilts.

8. Apparatus for supporting a load according to claim 7, wherein said second pivot point coincides with one of said areas of support.

9. Apparatus for supporting a load according to claim 7, further comprising a further link between said pivot apparatus and said base, said further link having a third pivot point at said base and a fourth pivot point at said pivot apparatus, said further link rotates either towards or away from said base as said load tilts.

10. Apparatus for supporting a load according to claim 9, wherein said second pivot point coincides with another of said areas of support.

11. Apparatus for supporting a load according to claim 9, said second pivot point and said fourth pivot point rotate about parallel axes.

12. Apparatus for supporting a load according to claim 1, further comprising:
a second pivot apparatus coupled to a second base;
said second base stationary relative to said second pivot apparatus;
at least two further areas of support between said second pivot apparatus and said second base, wherein respectively opposite force components are at said two further areas of support;
said two further areas of support move along at least one further curved path to tilt said load.

13. Apparatus for supporting a load according to claim 1, further comprising a hollow ring which is rotatable to rotate said load about an axis orthogonal to a further axis about which said load tilts.

14. Apparatus for supporting a load according to claim 13, wherein a portion of said hollow ring is removable.

15. Apparatus for supporting a load according to claim 14, wherein a cable is situated within said ring.

16. Apparatus for supporting a load according to claim 1, wherein said base is a substantially c-shaped member with an opening extending from a side thereof.

17. Apparatus for supporting a load according to claim 16, wherein a cable is situated in said opening.

18. Apparatus for supporting a load according to claim 1, wherein
a) said two areas of support rotate clockwise causing said load to rotate clockwise and said two areas of support rotate counterclockwise causing said load to rotate counterclockwise; or
b) said two areas of support rotate clockwise causing said load to rotate counterclockwise and said two areas of support rotate counterclockwise causing said load to rotate clockwise;
and wherein, as said load rotates clockwise or counterclockwise, the load is in a balanced state both before and after the clockwise rotation and the counterclockwise rotation.

19. Apparatus for supporting a load according to claim 1, wherein said actuator includes a spring like member, said spring like member compresses responsive to torque being applied to said load to rotate said load about said axis.

20. Apparatus for supporting a load according to claim 1, said apparatus further comprising a stand for preventing orientation of said axis which intersects said load from being above said two areas of support.

21. A method for moving a load, comprising:
maintaining a base stationary relative to a pivot apparatus which is moveable relative to said base,
wherein at least two areas of support are between said pivot apparatus and said base, and wherein respectively opposite force components generated by earth gravity pulling said load downward
a) intersect at said location; and
b) are at said two areas of support;
one of said areas of support is vertically higher than another of said areas of support
drawing
a) a holding block coupled to and movable with said pivot apparatus towards or away from
b) an adjuster bracket attached to said base
by actuating an actuator located between said holding block and said adjuster bracket in order to
c) move said two areas of support in a direction between said vertically higher elevation and said vertically lower elevation;
d) move said two areas of support along at least one curved path between said vertically higher elevation and said vertically lower elevation, and
e) rotate said load about an axis which intersects said load.

22. A method for moving a load according to claim 21, wherein circular members at said two areas of support move along said curved path to tilt said load.

23. A method for moving a load according to claim 21, wherein at least one member at said two areas of support moves along said curved path to tilt said load.

24. A method for moving a load according to claim 21, wherein said curved path is concave relative to said load.

25. A method for moving a load according to claim 21, wherein said curved path is oriented in a vertical plane, and wherein said two areas of support move upward along said curved path so that a surface of said load opposite to a further surface of said load, facing said curved path, tilts downwards.

26. A method for moving a load according to claim 21, wherein movement of said two areas of support along said curved path results in said load tilting about said axis which intersects said load wherein said axis substantially intersects a center of gravity of said load.

27. A method for moving a load according to claim 21, further comprising the step of rotating said load about an axis orthogonal to a further axis about which said load tilts.

28. A method for moving a load according to claim 21, wherein a link is situated between said pivot apparatus and said base, said link having a first pivot point at said base and a second pivot point at said pivot apparatus, said link rotates either towards or away from said base as said load tilts.

29. A method for moving a load according to claim 28, wherein said second pivot point coincides with one of said areas of support.

30. A method for moving a load according to claim 28, wherein a further link is situated between said pivot apparatus and said base, said further link having a third pivot point at said base and a fourth pivot point at said pivot apparatus, said further link rotates either towards or away from said base as said load tilts.

31. Apparatus for moving a load according to claim 30, wherein said second pivot point coincides with another of said areas of support.

32. A method of moving a load according to claim 30, wherein said second pivot point and said fourth pivot point rotate about parallel axes.

33. A method of moving a load according to claim 21, wherein:
a second pivot apparatus is coupled to a second base;

said second base is stationary relative to said second pivot apparatus;

at least two further areas of support are between said second pivot apparatus and said second base, and respectively opposite force components are at said two further areas of support;

said two further areas of support move along at least one further curved path to tilt said load.

34. A method of moving a load according to claim 21, wherein a hollow ring is rotated in order to rotate said load about an axis orthogonal to a further axis about which said load tilts.

35. A method of moving a load according to claim 34, further comprising the step of removing a portion of said hollow ring.

36. A method of moving a load according to claim 35, further comprising the step of situating a cable within said ring.

37. A method of moving a load according to claim 21, further comprising the step of situating a cable through an opening in said base, said base being c-shaped, said opening extending from a side of said base.

38. A method for moving a load according to claim 21, wherein a) said two areas of support rotate clockwise causing said load to rotate clockwise and said two areas of support rotate counterclockwise causing said load to rotate counterclockwise; or b) said two areas of support rotate clockwise causing said load to rotate counterclockwise and said two areas of support rotate counterclockwise causing said load to rotate clockwise;

and wherein, as said load rotates clockwise or counterclockwise, the load is in a balanced state both before and after the clockwise rotation and the counterclockwise rotation.

39. A method for moving a load according to claim 21, further comprising the step of applying torque to said load to rotate said load about said axis, wherein a spring like member included in said actuator compresses responsive to said torque being applied to said load.

40. A method for moving a load according to claim 21, further comprising the step of providing a stand for preventing orientation of said axis which intersects said load from being above said two areas of support.

\* \* \* \* \*